(12) United States Patent
Tomimatsu et al.

(10) Patent No.: US 8,680,465 B2
(45) Date of Patent: Mar. 25, 2014

(54) CHARGED PARTICLE BEAM APPARATUS AND FILM THICKNESS MEASUREMENT METHOD

(75) Inventors: Satoshi Tomimatsu, Hitachinaka (JP);
Tsuyoshi Onishi, Hitachinaka (JP);
Toshihide Agemura, Tsuchiura (JP);
Terutaka Nanri, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/498,994

(22) PCT Filed: Oct. 12, 2010

(86) PCT No.: PCT/JP2010/067824
§ 371 (c)(1),
(2), (4) Date: Mar. 29, 2012

(87) PCT Pub. No.: WO2011/046093
PCT Pub. Date: Apr. 21, 2011

(65) Prior Publication Data
US 2012/0187292 A1    Jul. 26, 2012

(30) Foreign Application Priority Data
Oct. 15, 2009    (JP) .................. 2009-237830

(51) Int. Cl.
*H01J 37/26* (2006.01)

(52) U.S. Cl.
USPC ............ 250/306; 250/307; 250/311; 250/397

(58) Field of Classification Search
USPC .......................................... 250/307, 311, 397
See application file for complete search history.

(56) References Cited

U.S. PATENT DOCUMENTS

| | | | |
|---|---|---|---|
| 5,051,585 A | 9/1991 | Koshishiba et al. | |
| 5,525,806 A | 6/1996 | Iwasaki et al. | |
| 5,656,811 A * | 8/1997 | Itoh et al. | 850/43 |
| 6,787,773 B1 * | 9/2004 | Lee | 250/311 |
| 7,105,816 B2 | 9/2006 | Kamiya et al. | |

(Continued)

FOREIGN PATENT DOCUMENTS

| | | |
|---|---|---|
| JP | 63-266754 A | 11/1988 |
| JP | 2-15545 A | 1/1990 |

(Continued)

OTHER PUBLICATIONS

International Search Report with English translation dated Nov. 30, 2010 (four (4) pages).

(Continued)

*Primary Examiner* — Jack Berman
*Assistant Examiner* — Kevin Chung
(74) *Attorney, Agent, or Firm* — Crowell & Moring LLP

(57) ABSTRACT

A charged particle beam apparatus of the present invention comprises a transmission electron detector (113; 206) having a detection portion divided into multiple regions (201 to 205; 301 to 305), wherein a film thickness of a sample is calculated by detecting a transmission electron beam (112) generated from the sample when the sample is irradiated with an electron beam (109), as a signal of each of the regions in accordance with scattering angles of the transmission electron beam, and thereafter calculating the intensities of the individual signals. According to the above, there is provided a charged particle beam apparatus capable of performing accurate film thickness monitoring while suppressing an error due to an external condition and also capable of processing a thin film sample into a sample having an accurate film thickness, which makes it possible to improve the accuracy in structure observations, element analyses and the like.

26 Claims, 20 Drawing Sheets

(56) References Cited

U.S. PATENT DOCUMENTS

| | | | |
|---|---|---|---|
| 7,928,377 B2 | 4/2011 | Ishitani et al. | |
| 2003/0089852 A1* | 5/2003 | Ochiai et al. | 250/310 |
| 2003/0132382 A1* | 7/2003 | Sogard | 250/311 |
| 2004/0238752 A1 | 12/2004 | Tanba et al. | |
| 2006/0097166 A1 | 5/2006 | Ishitani et al. | |
| 2006/0145075 A1* | 7/2006 | Terada et al. | 250/310 |
| 2007/0235645 A1 | 10/2007 | Tanba et al. | |
| 2009/0020698 A1* | 1/2009 | Muto et al. | 250/310 |
| 2009/0050803 A1 | 2/2009 | Tanba et al. | |
| 2012/0043463 A1 | 2/2012 | Agemura et al. | |

FOREIGN PATENT DOCUMENTS

| | | | |
|---|---|---|---|
| JP | 5-234557 A | 9/1993 |
| JP | 6-231720 A | 8/1994 |
| JP | 3119959 B2 | 10/2000 |
| JP | 3221797 B2 | 8/2001 |
| JP | 3223431 B2 | 8/2001 |
| JP | 2003-249186 A | 9/2003 |
| JP | 2004-214065 A | 7/2004 |
| JP | 2006-127850 A | 5/2006 |
| JP | 2007-193977 A | 8/2007 |
| JP | 2009-193968 A | 8/2009 |
| JP | 2010-257855 A | 11/2010 |

OTHER PUBLICATIONS

Form PCT/ISA/237 (four (4) pages).

Japanese Office Action dated Dec. 5, 2012 and translation thereof (4 pages).

* cited by examiner

CHARGED PARTICLE BEAM APPARATUS AND FILM THICKNESS MEASUREMENT METHOD

TECHNICAL FIELD

The present invention relates to a charged particle beam apparatus capable of film thickness monitoring.

BACKGROUND ART

There are increasing needs for inspections and analyses of semiconductor devices advancing in miniaturization. Among them, an essential technique for a failure analysis for identifying a cause of defect is to directly observe a defect inside a device. For such observation, it is necessary to perform accurate microfabrication of the observation target position of the device. Focused ion beam (hereinafter, FIB) processing systems have been heretofore used as apparatuses for performing the accurate microfabrication. The FIB systems are each capable of accurately processing the target position by performing electrostatic deflection scanning with an ion beam focused to a submicron size and irradiating the sample with the ion beam. Thus, the FIBs are used in formation of cross sections for analyses, fabrication of samples for analyses, and the like.

Transmission electron microscopes (hereinafter, TEM), scanning transmission electron microscopes (hereinafter, STEM), and the like are used in high-resolution observations. In order to observe a sample by using the TEM or STEM, the sample needs to be processed to have a thickness small enough for an electron beam to pass through the sample, e.g., approximately 100 nm. Because of the recent advancement in miniaturization of the devices, the film thickness management of thin film samples becomes important for sample fabrication by which the observation target position should be accurately positioned within each thin film sample.

Examples of a technique to monitor the thickness of a thin film include the techniques respectively disclosed in Japanese Patent No. 3223431 (Patent Document 1) and Japanese Patent 3221797 (Patent Document 2). In these techniques, the thin film to be processed by an FIB is irradiated with an electron beam and a transmission electron volume of the electron beam is detected to monitor the film thickness of the thin film to be processed. Furthermore, Japanese Patent No. 3119959 (Patent Document 3) discloses that a thin film to be processed by an FIB is irradiated with an electron beam, the irradiation intensity and transmission intensity of the electron beam are detected, and the film thickness is monitored by using the intensity ratio therebetween. Moreover, Japanese Patent Application Publication No. 2006-127850 (Patent Document 4) discloses that a thin film to be processed by an FIB is irradiated with an electron beam, a signal luminance change is detected by a transmission electron detector and a scattered electron detector, and whether the film thickness is a desired one is determined based on the signal luminance change.

PRIOR ART DOCUMENTS

Patent Documents

Patent Document 1: Japanese Patent No. 3223431
Patent Document 2: Japanese Patent No. 3221797
Patent Document 3: Japanese Patent No. 3119959
Patent Document 4: Japanese Patent Application Publication No. 2006-127850

SUMMARY OF THE INVENTION

Problem to be Solved by the Invention

As a result of a keen study of film thickness monitoring, the inventors of the present application have obtained the following findings.

The use of an electron beam in film thickness monitoring of a sample to be processed is very effective because film thickness information on a local region can be acquired. However, even though samples have the same film thickness, the transmission electron volumes differ therebetween depending on materials forming the samples. For this reason, acquisition of accurate film thickness information requires a film thickness calculation means with sample material information taken into consideration.

Moreover, the irradiation volume of an electron beam used in irradiation changes in accordance with the condition of the electron source and thereby is not always constant. The transmission electron volume also fluctuates because of the change in the irradiation volume. For this reason, acquisition of accurate film thickness information requires a film thickness calculation means capable of canceling the influence of the change in the irradiation volume.

An object of the present invention relates to providing a charged particle beam apparatus capable of accurate film thickness monitoring while suppressing an error due to an external condition.

Means For Solving Problem

The present invention relates to: irradiating a sample with an electron beam; individually detecting signals of regions in accordance with scattering angles of a transmission electron beam; calculating the intensities of the individual signals; and calculating an accurate film thickness.

Effects of the Invention

The present invention makes it possible to process a thin film sample into a sample having an accurate film thickness and thereby to improve the accuracy in structure observations, element analyses and the like.

MODES FOR CARRYING OUT THE INVENTION

Figure 1:
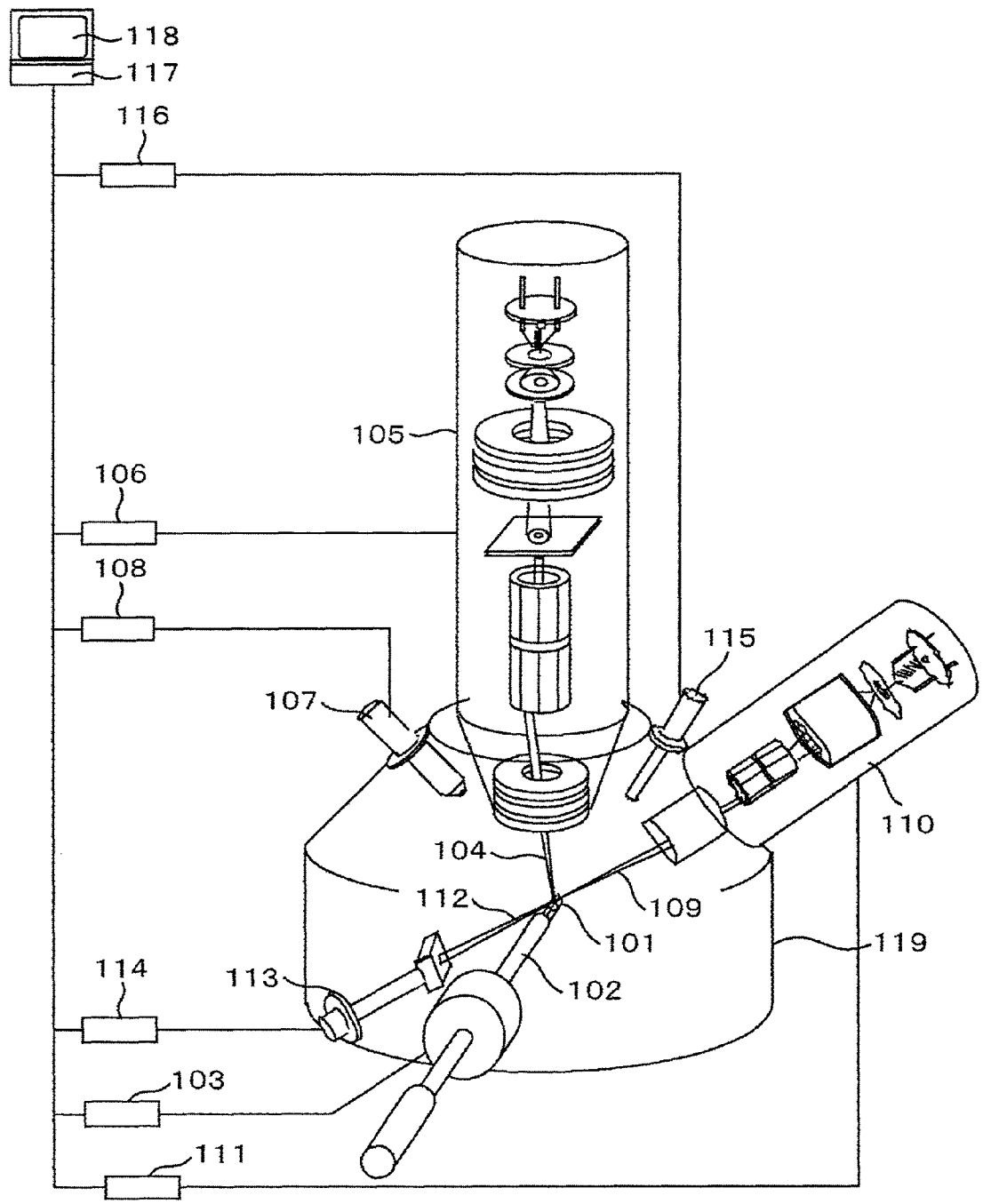
FIG. 1 is a diagram showing a configuration example of a charged particle beam apparatus.

Embodiments disclose a charged particle beam apparatus including: an electron beam optical system configured to perform irradiation with an electron beam; a sample stage on which a sample is to be placed; a transmission electron detector which has a detection portion divided into multiple regions and which is configured to detect a transmission electron; a calculation mechanism configured to calculate an intensity ratio of a transmission electron beam detected by a first region of the multiple regions to a transmission electron beam detected by a second region thereof; and a display device configured to display a film thickness of the sample.

Moreover, the embodiments disclose a film thickness measurement method for a sample, the method including: irradiating a sample with an electron beam by an electron beam optical system; detecting a transmission electron beam having passed through the sample, by a transmission electron detector including a detection portion divided into multiple regions; calculating, by a calculator, an intensity ratio of a transmission electron beam detected by a first region of the multiple regions to a transmission electron beam detected by a second region thereof; and displaying a film thickness of the sample by a display unit.

In addition, the embodiments disclose that a transmission electron beam intensity detected by a region for detecting a transmission electron beam at a small scattering angle is divided by a transmission electron beam intensity detected by a region for detecting a transmission electron beam at a large scattering angle.

Furthermore, the embodiments disclose that the first region and/or the second region is changed in a case where transmission electron beam detection detected by the first region and/or the second region meets a predetermined condition.

Moreover, the embodiments disclose that the first region and/or the second region is changed on the basis of a constituent element of a portion of the sample which is irradiated with the electron beam.

Furthermore, the embodiments disclose that a spectroscopic detector configured to detect a constituent element of the sample is included. Moreover, the spectroscopic detector is preferably an X-ray detector.

In addition, the embodiments disclose an input device configured to input a constituent element of the sample. Moreover, the embodiments disclose that the constituent element of the sample is inputted to the calculator by the input device.

Furthermore, the embodiments disclose that an average film thickness in a desired region of the sample is displayed.

Moreover, the embodiments disclose that a film thickness distribution in a desired region of the sample is displayed.

Additionally, the embodiments disclose the charged particle beam apparatus further including an ion beam optical system configured to irradiate the sample with an ion beam. In addition, the embodiments disclose that a thin film is formed in the sample by irradiating the sample with an ion beam by the ion beam optical system.

Moreover, the embodiments disclose that the irradiation with the ion beam is controlled on the basis of output of the calculation mechanism.

Furthermore, the embodiments disclose the charged particle beam apparatus capable of emitting the ion beam and the electron beam simultaneously. In addition, the embodiments disclose that the formation of a thin film in the sample by the irradiation with the ion beam and measurement of the thin film by the irradiation with the electron beam are performed simultaneously.

Furthermore, the embodiments disclose the charged particle beam apparatus further including a transport mechanism configured to transport a sample piece separated from an original sample by ion beam processing. In addition, the embodiments disclose that a film thickness of the sample piece separated from the original sample by ion beam processing is measured.

The aforementioned aspects and effects as well as other new aspects and effects will be described below with reference to the drawings. Note that, the drawings are used for understanding of the invention and are not intended to restrict the scope of claims. In addition, embodiments can be appropriately combined, and a combination of embodiments is also disclosed in this description.

Embodiment 1

In this embodiment, a description will be given of a charged particle beam apparatus capable of accurately monitoring a film thickness of a sample to be processed by an ion beam.

FIG. 1 shows a configuration example of a charged particle beam apparatus. The charged particle beam apparatus of this embodiment comprises: a sample stage 102, which is movable and on which a sample 101 is placed; a sample position control unit 103, which controls the position of the sample stage 102 for specifying an observation or processing position of the sample 101; an ion beam optical system 105, which performs processing by irradiating the sample 101 with an ion beam 104; an ion beam optical system control unit 106, which controls the ion beam optical system 105; and a secondary electron detector 107, which detects secondary electrons from the sample 101. A secondary electron detector control unit 108 controls the secondary electron detector 107. An electron beam optical system control unit 111 controls an electron beam optical system 110, which irradiates the sample 101 with an electron beam 109. A transmission electron detector control unit 114 controls a transmission electron detector 113, which detects a transmission electron beam 112 that has passed through the sample 101. An X-ray detector control unit 116 controls an X-ray detector 115, which detects X-rays excited from the sample 101 by irradiation of the sample 101 with the electron beam 109. A central processor 117 controls the sample position control unit 103, the ion beam optical system control unit 106, the secondary electron detector control unit 108, the electron beam optical system control unit 111, and the transmission electron detector control unit 114, and the X-ray detector 115 or the like. As the central processor 117, a personal computer or a workstation is used in general, for example. Moreover, the charged particle beam apparatus comprises a display device 118, which displays output from the central processor 117 on a screen. The sample stage 102, the ion beam optical system 105, the secondary electron detector 107, the electron beam optical system 110, the transmission electron detector 113, and the X-ray detector 115 or the like are placed in a vacuum case 119. In this configuration, the sample 101 placed on the sample stage 102 is processed by irradiating the sample 101 with the ion beam 104, which is formed by the ion beam optical system 105, and the thickness of the sample 101 is monitored by a signal of the transmission electron detector 113.

Note that, in the charged particle beam apparatus of Embodiment 1, the ion beam optical system 105 is arranged in a vertical direction, and the electron beam optical system 110 is arranged in an oblique direction. However, the arrangement form of the optical systems is not limited to this form. For example, the ion beam optical system 105 may be arranged in an oblique direction, and the electron beam optical system 110 may be arranged in a vertical direction. Moreover, both of the ion beam optical system 105, and the electron beam optical system 110 may be arranged obliquely.

Figure 2:
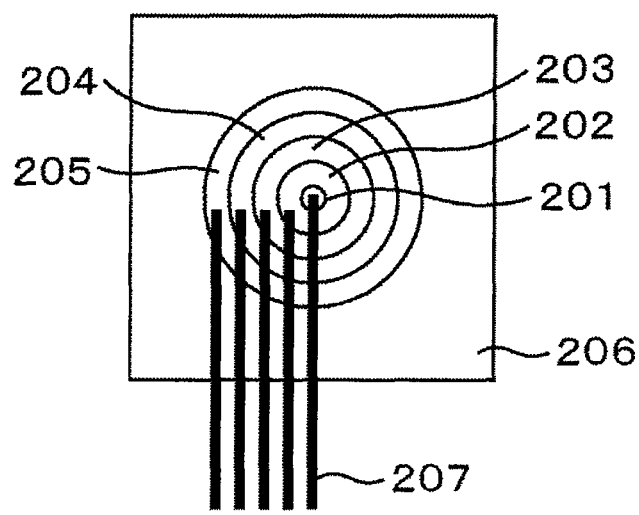
FIG. 2 is a diagram showing a configuration example of a divided type transmission electron detector of a concentric type.
Figure 3:
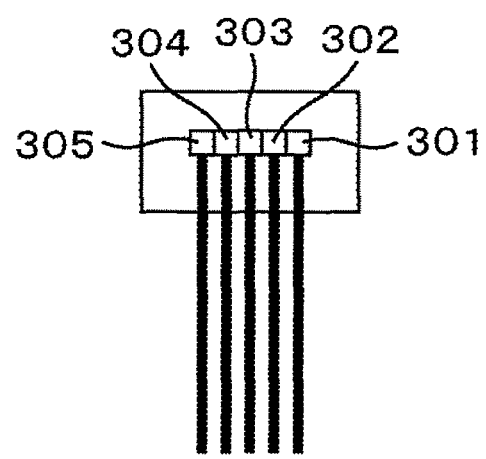
FIG. 3 is a diagram showing a configuration example of a divided type transmission electron detector of a line type.

Here, a specific configuration example of the transmission electron detector 113 will be described. FIG. 2 shows a detector having detection regions formed by dividing a region into concentric regions. Although the example in which a region is divided into five regions 201 to 205 is shown herein, this embodiment can be carried out as long as the region is divided into two or more regions. The transmission electron detector control unit 114 in FIG. 1 controls the position of a detector 206 and performs positioning in such a way that the position of the detector 206 which is directly irradiated with the electron beam 109 when the sample 101 is absent should be positioned in the region 201 at the center of the detector 206. Wires 207 or the like are used to send signals of the respective regions to the transmission electron detector control unit 114. The detector 206 is configured of a semiconductor detector or the like, for example. In this case, the regions 201 to 205 are insulated from each other, and the signals in the respective regions 201 to 205 are prevented from mixing with each other. When the semiconductor detector is irradiated with the transmission electron beam 112, electron-hole pairs dependent on electron energy are formed. In case of a silicon semiconductor detector, for example, the electron-hole pair creation energy at room temperature is approximately, 3.6 eV. Thus, if the energy of the transmission electron beam 112 is 30 kV, approximately 8,000 electron-hole pairs are created per electron. The electron-hole pairs are detected via the wires 207 as a current, and thereby, the transmission electron volume is monitored. The electron detector 206 is not necessarily formed of a single layer. A hole may be formed in a portion of the region 201, for example, to implement a detector in a second layer. In this case, it is made possible to accurately detect only an electron that has passed through the hole in the first layer. Moreover, the detector is not necessarily formed in a concentric circle as shown in FIG. 2. For example, the detector may be formed of regions 301 to 305 as shown in FIG. 3, and positioning is performed in such a way that the region 301 should correspond to the region 201 in FIG. 2. Accordingly, the region 301 may be configured to detect a signal near the center and the region 305 may be configured to detect an outer side signal in this case. This structure has an advantage that the structure is simple and easily placed in a narrow space. Meanwhile, the detector formed in the concentric circle in FIG. 2 has an advantage that the quantity of an outer side signal is large.

Figure 4:
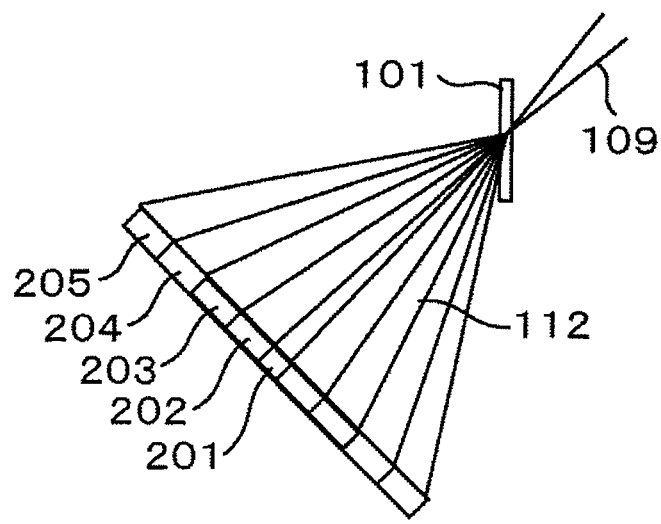
FIG. 4 is a diagram showing an aspect of light reception of sample-transmitted electrons by the divided type transmission electron detector.

How the detector 206 is irradiated with the transmission electron beam 112, which has passed through the sample 101, will be described using FIG. 4. FIG. 4 shows a diagram when the detector 206 is viewed in a cross section passing through the center of the detector 206. The electron beam 109 with which the sample 101 is irradiated becomes the transmission electron beam 112 after the electron beam 109 spreads due to interaction with the sample. Thus, the regions 201 to 205 of the detector 206 are irradiated with the transmission electron beam 112. The region 201 located near the center is irradiated with a portion of the electron beam that has passed through the sample without receiving the influence of scattering within the sample 101 as much as the other portions of the electron beam. An image obtained by imaging the sample with the signal that has not received the scattering as much as the other signals is called a bright field image (hereinafter, a BF image) in general. Meanwhile, the outer side region 205 is irradiated with a portion of the electron beam that has received the scattering in the sample 101 to a large extent. An image obtained by imaging the sample with the signal that has received the scattering to a large extent is called a dark field image (hereinafter, a DF image) in general. However, the boundary between the BF and DF is not determined physically, but is determined relatively. In the case of Embodiment 1, for example, the regions 201 and 202 are each determined to be a BF, and the regions 203 to 205 are each determined to be a DF, for the sake of convenience, and the regions 201 and 202 are termed as BF1 and BF2, respectively, and the regions 203, 204, and 205 are termed as DF1, DF2 and DF3, respectively.

Figure 5:
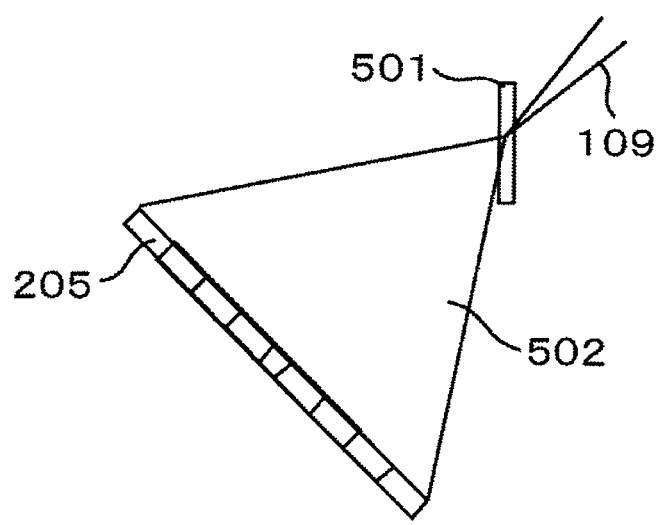
FIG. 5 is a diagram for describing spreading of sample-transmitted electrons in case of a thick sample.
Figure 6:
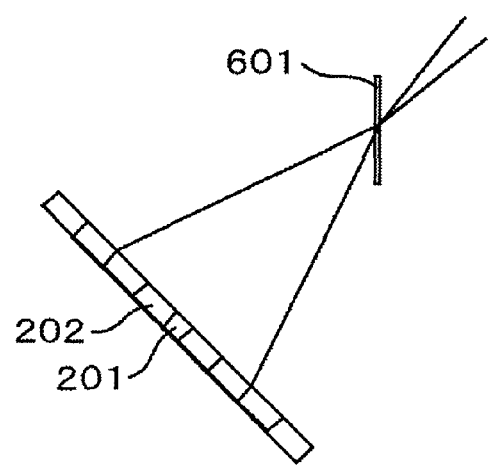
FIG. 6 is a diagram for describing spreading of sample-transmitted electrons in case of a thin sample.

Here, a relation between a distribution of the transmission electron beam and a film thickness of a sample is described using FIG. 5 and FIG. 6. FIG. 5 shows a case of a relatively thick sample. In this case, the probability of the electron beam being scattered is relatively large because the electron beam 109 interacts with a large number of atoms while passing through a sample 501. For this reason, a transmission electron beam 502 spreads, and the region 205 located in an outer side is irradiated with a large portion of the electron beam. Meanwhile, in a case where a sample 601 is relatively thin as shown in FIG. 6, the probability of the electron beam traveling in a straight line is relatively large because the interaction of the electron beam with the atoms of the sample is small. For this reason, the signal intensity in each of the regions 201, 202, and the like near the center becomes large. Note that, the irradiation regions are shown as if they represent the boundary lines of the electron beam in FIG. 5 and FIG. 6, but it is not true that only the regions inside of the respective irradiation regions are irradiated with the electron beam. Rather, FIG. 5 and FIG. 6 show whether the intensity inside of the region tends to increase or not as a comparison between samples having a large film thickness and a small film thickness in a visually understandable way. Thus, the actual electron beam is distributed between the regions 201 to 205 in certain proportions.

Figure 7:
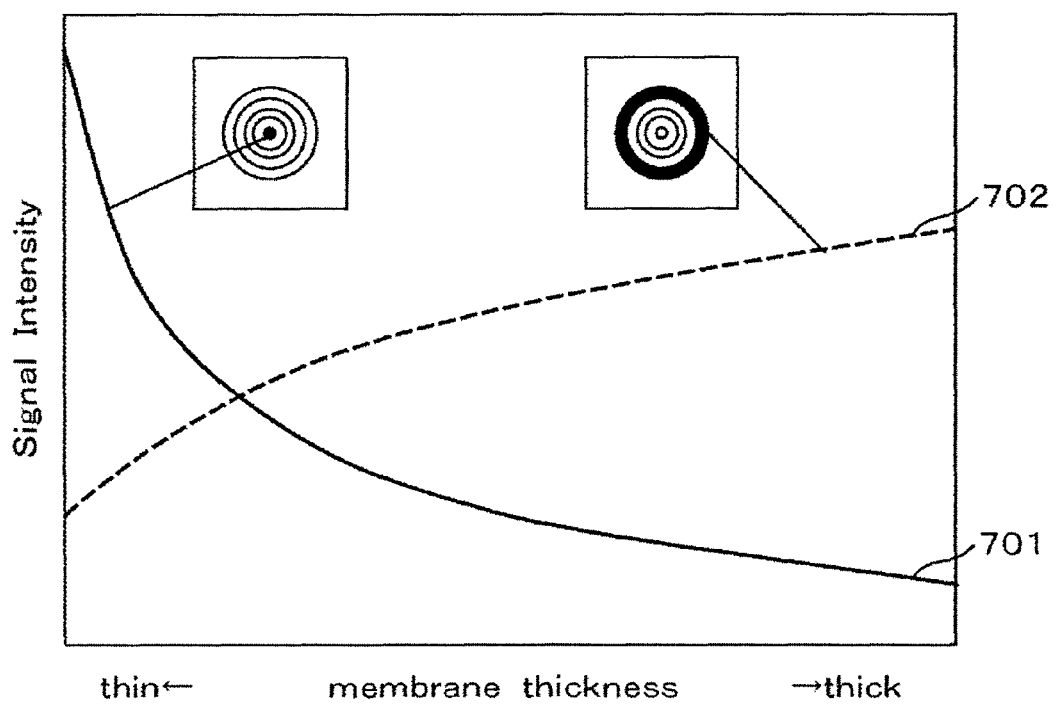
FIG. 7 is a diagram showing film thickness dependency of signal intensities due to light reception regions of a transmission electron detector.
Figure 8:
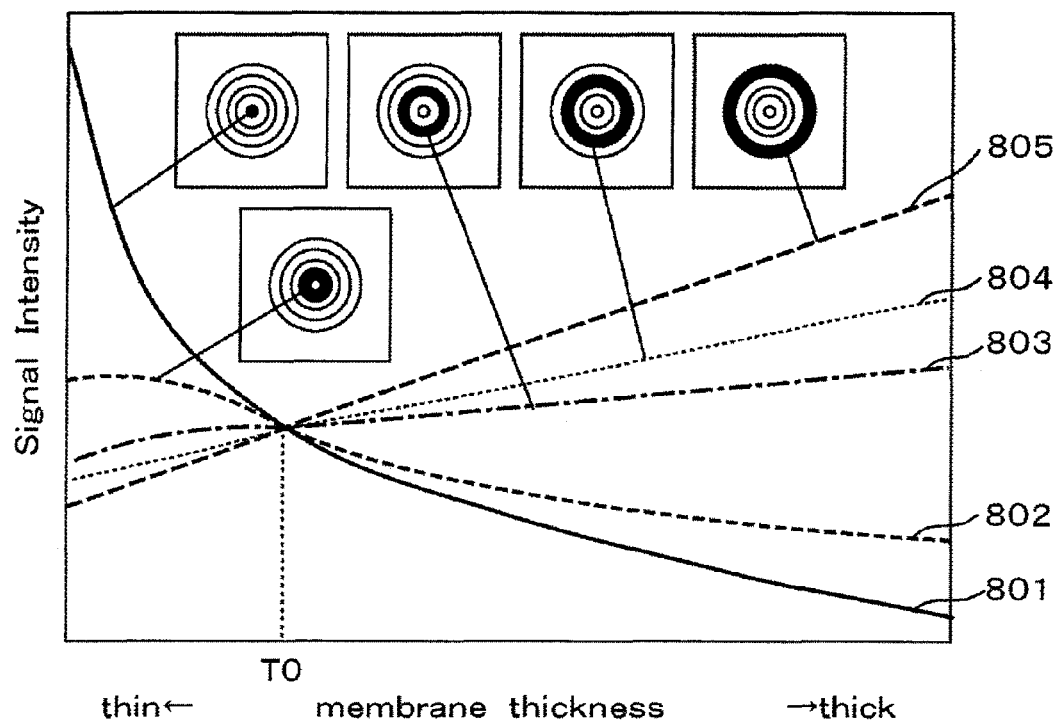
FIG. 8 is a diagram showing film thickness dependency of signal intensities of normalized signals, due to light reception regions of the transmission electron detector.
Figure 9:
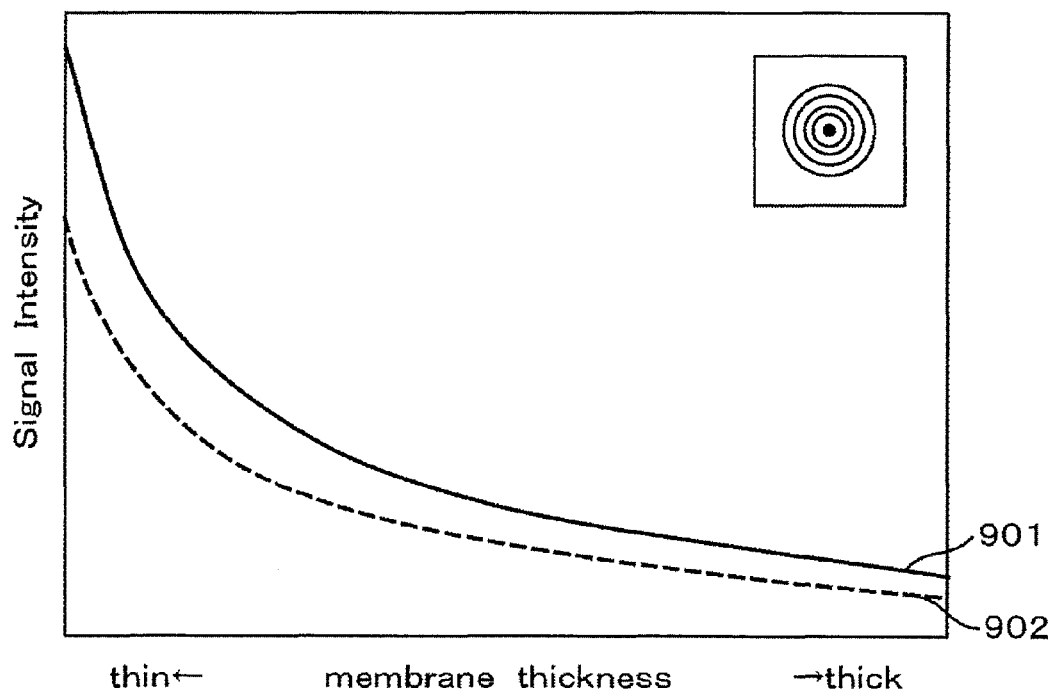
FIG. 9 is a diagram showing film thickness dependency of signal intensities of a BF1 due to a change in the intensity of an irradiation electron beam.

FIG. 7 and FIG. 8 show film thickness dependency of signal intensities due to light reception regions of a transmission electron detector. FIG. 7 shows a signal intensity 701 of the BF1 (signal of the region 201) and a signal intensity 702 of the DF3 (signal of the region 205), representatively and understandably. As described in FIG. 5 and FIG. 6, the signal intensity 701 of the BF1 increases as the film thickness becomes thinner (as the signal intensity moves to the left side of the graph), and the signal intensity 702 of the DF3 decreases as the film thickness becomes thinner (as the signal intensity moves to the left side of the graph). FIG. 8 is a graph showing the signal intensities of the five regions, and each of the signals is normalized by a signal quantity of a certain film thickness T0. In this case, a signal intensity 801 of the BF1 increases monotonically as the film thickness decreases, and a signal intensity 802 of the BF2 has a peak while the film thickness decreases. Meanwhile, a signal intensity 803 of the DF1, a signal intensity 804 of the DF 2, and a signal intensity 805 of the DF 3 decrease monotonically as the film thickness decreases. However, such a trend depends on elements as will be described later, and thus changes. It is necessary to understand that the DF1 does not necessarily decrease monotonically as the film thickness decreases, and that the DF1 decreases monotonically as shown in FIG. 8 only with a certain element (silicon, for example), for example. This series of descriptions is provided under a condition that the trend shown in FIG. 7 and FIG. 8 exists with a certain element (silicon, for example). Here, if the trend shown is guaranteed, the film thickness can be found by back calculation from the signal value of the BF1, for example. However, the absolute value of the signal intensity 701 fluctuates depending on the intensity of the electron beam 109. The intensity of the electron beam 109 fluctuates depending on a condition or the like of the electron beam optical system 110 in FIG. 1. A change in the intensity of the electron beam caused by a condition controllable by the electron beam optical system control unit 111, such as the strength of a lens, can be estimated to a certain extent. However, there are many cases where the intensity of the electron beam fluctuates due to an unexpected change in the state of the electron source, or the like, and it is thus very difficult to keep the intensity of the irradiation electron beam constant. For this reason, when the intensity of the irradiation electron beam is reduced, the signal of the BF1 decreases in its signal intensity from a signal intensity 901 to a signal intensity 902 as shown in FIG. 9. In this case, even if the signal of the BF1 can be acquired, the correct film thickness cannot be calculated because it is uncertain which one of the signal intensity 901 and the signal intensity 902 is correct.

Even if a change in the electron beam 109 is acquired by inserting a current detector or the like while interrupting the irradiation of the sample 101 with the electron beam, in order to detect an intensity fluctuation of the irradiation electron beam, the real-time film thickness monitoring cannot be performed because the transmission signal cannot be acquired simultaneously. Moreover, in a case where the detector is mechanically inserted between the electron source and the sample, it takes some time for the mechanical insertion. Here, a method in which the detector of irradiation electrons is irradiated with an electron beam by deflecting the electron beam to a large extent by using electromagnetic deflection is also conceivable, but such large deflection of the electron beam may cause shifting of the irradiation position when re-irradiation of the sample is performed, thereafter. For this reason, what is required is a method of suppressing a film thickness calculation error due to the intensity fluctuation of the irradiation electron beam without acquiring the intensity fluctuation of the irradiation electron beam.

Figure 10:
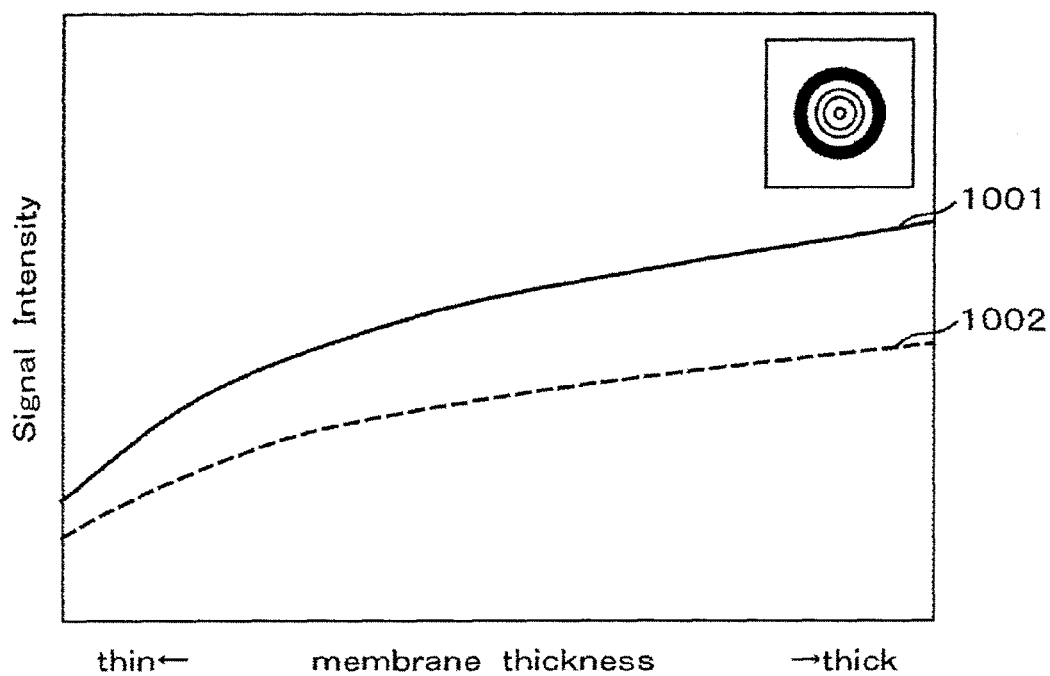
FIG. 10 is a diagram showing film thickness dependency of signal intensities of a DF3 due to a change in the intensity of the irradiation electron beam.
Figure 11:
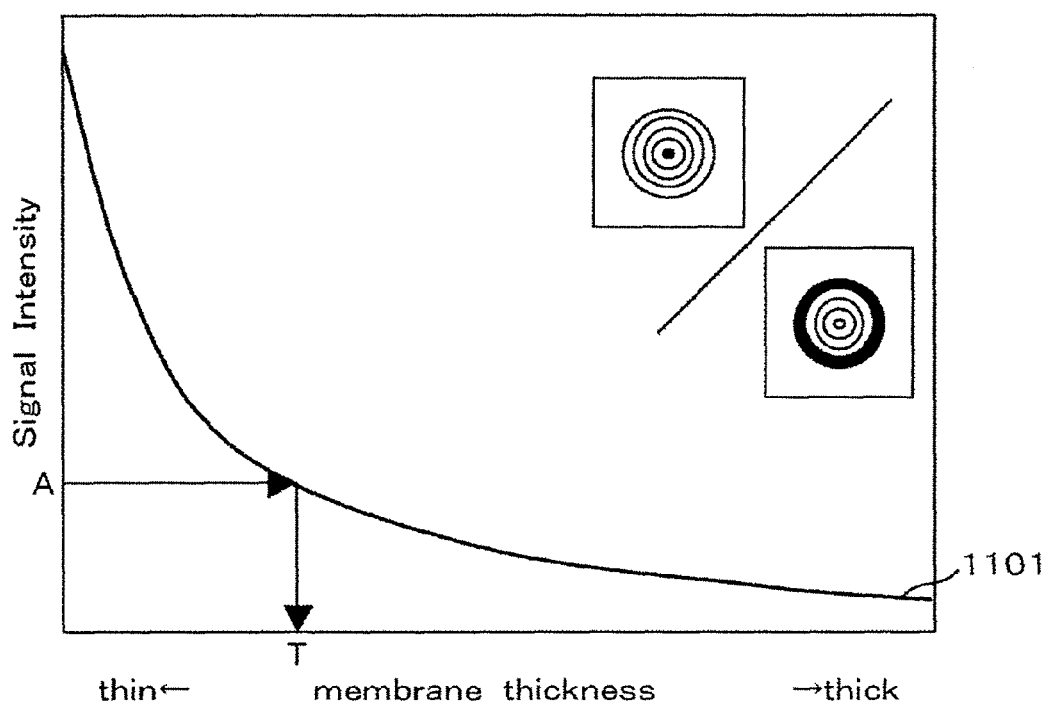
FIG. 11 is a diagram for describing film thickness dependency and film thickness calculation of a division signal.

Here, attention is focused on the signal of the DF3. As shown in FIG. 10, when the intensity of the irradiation electron beam is reduced, the signal intensity decreases from a signal intensity 1001 to a signal intensity 1002. At this time, a reduction ratio of the signal intensity 901 to the signal intensity 902 due to the decrease in the irradiation electron volume becomes equal to a reduction ratio of the signal intensity 1001 to the signal intensity 1002. For this reason, if the signal of the BF1 is divided by the signal of the DF3, the fluctuation of the electron beam 109 can be cancelled. FIG. 11 shows a graph of the film thickness dependency of this division signal. As described above, the influence of the intensity fluctuation of the irradiation electron beam can be ignored by performing the division. Moreover, the detector shown in FIG. 2 can acquire the signals of the BF1, DF3 and the like simultaneously. Thus, a result of the division can be acquired in real-time during irradiation. Furthermore, as described in FIG. 8, the BF1 having the signal, which increases monotonically due to a decrease in the film thickness, is divided by the DF3 having the signal, which decreases monotonically, and which has the largest change rate. Thus, a signal intensity 1101, which changes more precipitously than any other signals shown in FIG. 8, can be acquired. Such a precipitous change in the signal with respect to the film thickness means that the film thickness resolution is further increased. To put it specifically, if the acquired BF1/DF3 intensity is the signal intensity denoted by A, a film thickness T can be calculated from the intensity A with high accuracy.

Figure 12:
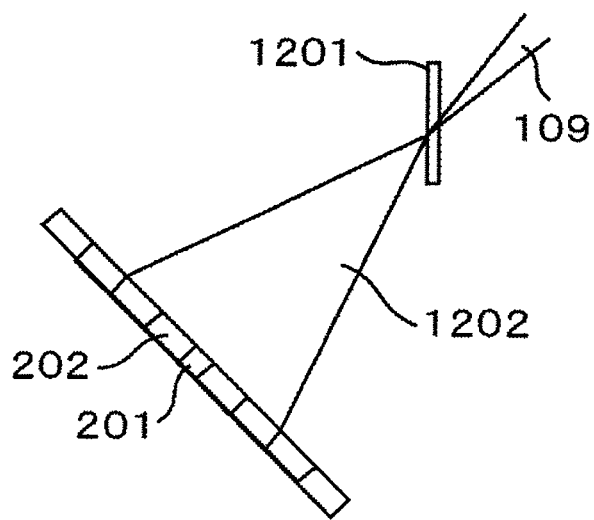
FIG. 12 is a diagram for describing spreading of sample-transmitted electrons in case of a sample material having a small atomic weight.
Figure 13:
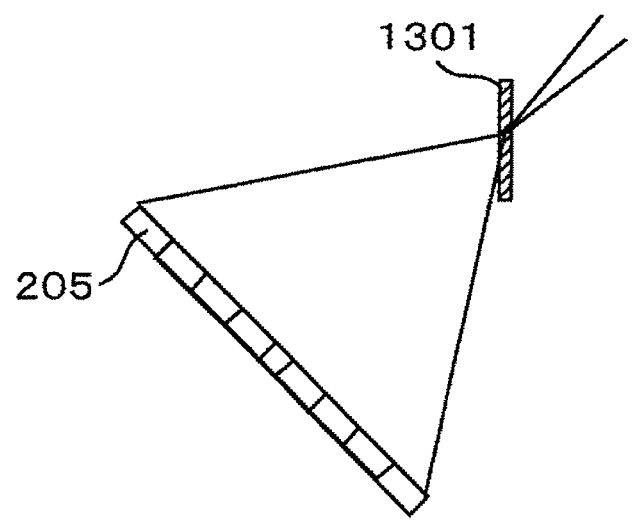
FIG. 13 is a diagram for describing spreading of sample-transmitted electrons in case of a sample material having a large atomic weight.

However, as described above, the relation between the film thickness of the sample and the transmission electron beam holds true for a certain specified element. Thus, a constituent element of the sample needs to be taken into consideration for calculations of the film thickness of the sample from the transmission electron beam. The relation between the distribution of a transmission electron beam and a sample constituent element will be described using FIG. 12 and FIG. 13. FIG. 12 shows a case of a sample of a relatively light (atomic weight is small) element. In this case, the electron beam 109 interacts with atoms of relatively light atomic weight while passing through a sample 1201. Accordingly, the probability of the electron beam being scattered is relatively small. Meanwhile, the probability of a transmission electron beam 1202 traveling in a straight line is relatively large. Thus, the signal intensity of each of the regions 201, 202, and the like located near the center becomes large in this case. On the other hand, in case of a sample 1301 of a relatively heavy (atomic weight is large) element as shown in FIG. 13, the electron beam spreads relatively, because the interaction of the electron beam with the atoms of the sample is large. Thus, the region 205 located in an outer side is irradiated with a large volume of the electron beam. Note that, the irradiation regions are shown as if they represent the boundary lines of the electron beam in FIG. 12 and FIG. 13, but it is not true that only the regions inside of the respective irradiation regions are irradiated with the electron beam. Rather, FIG. 12 and FIG. 13 show whether the intensity inside of the region tends to increase or not as a comparison between light and heavy sample constituent elements in a visually understandable way. Thus, the actual electron beam is distributed between the regions 201 to 205 in certain proportions.

Figure 14:
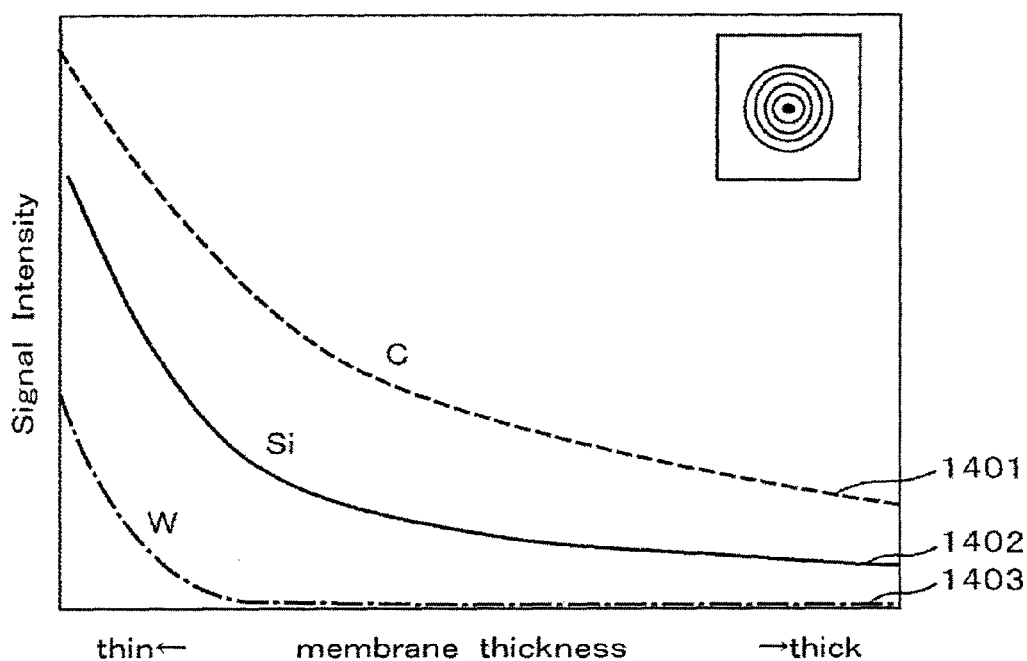
FIG. 14 is a diagram showing film thickness dependency of signal intensities of the BF1 due to a difference between sample constituent elements.
Figure 15:
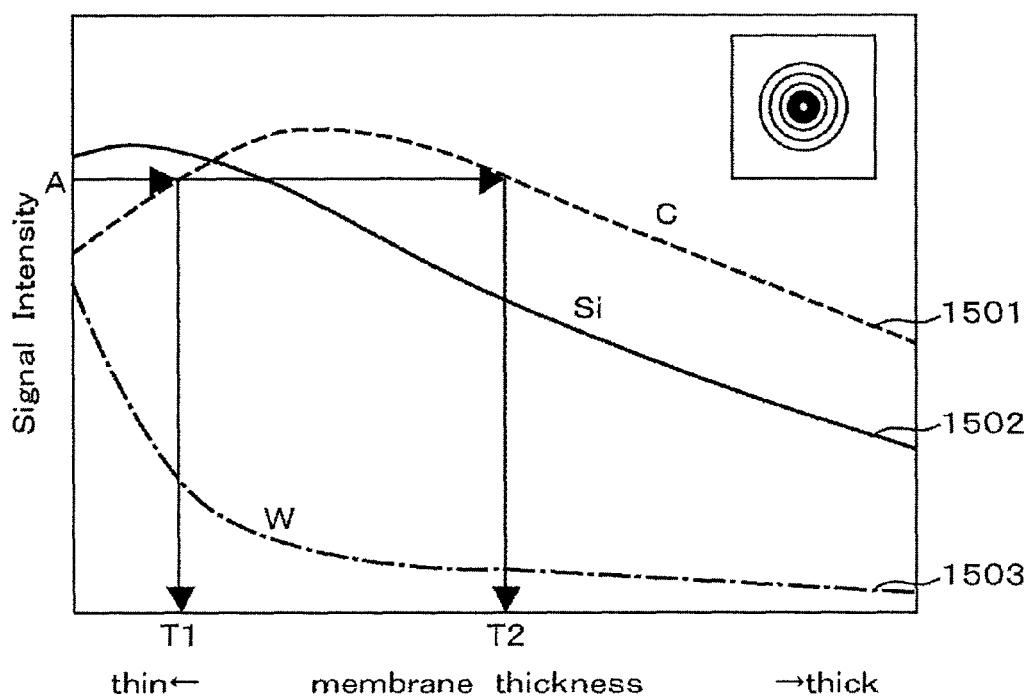
FIG. 15 is a diagram showing film thickness dependency of signal intensities of a BF2 due to a difference between sample constituent elements.
Figure 16:
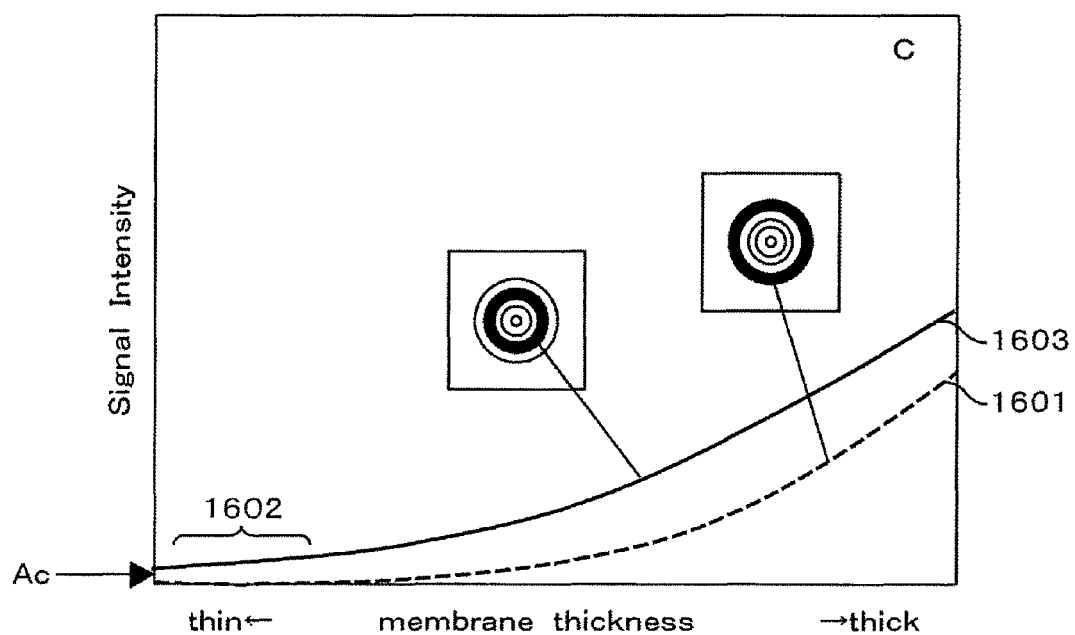
FIG. 16 is a diagram for describing appropriate light reception region selection of the transmission electron detector.
Figure 17:
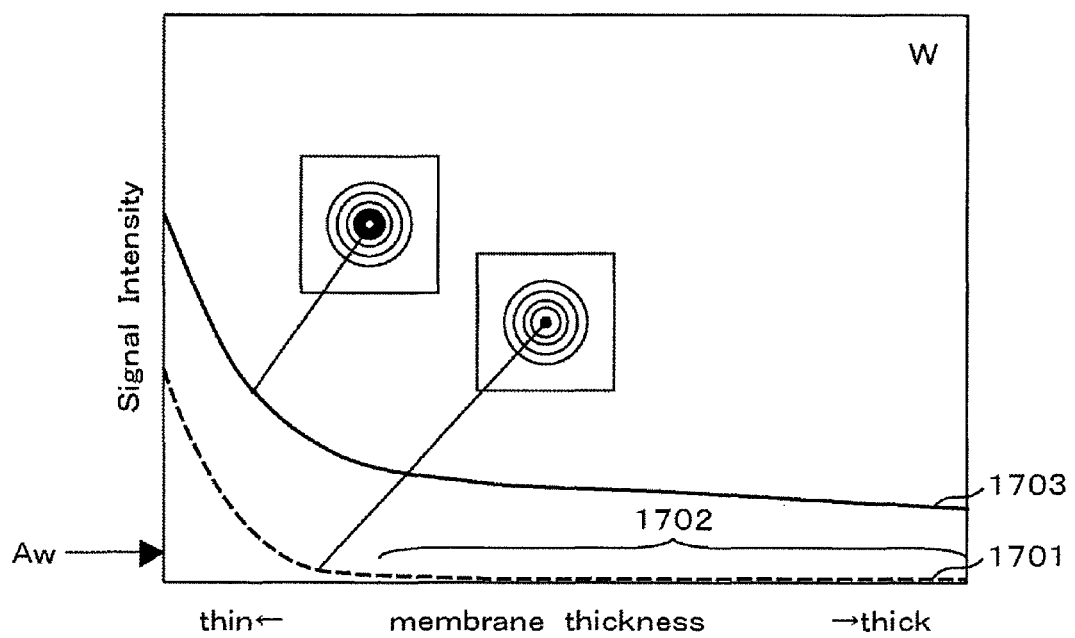
FIG. 17 is a diagram for describing appropriate light reception region selection of the transmission electron detector.

FIG. 14 and FIG. 15 show film thickness dependency of signal intensities due to a difference between sample constituent elements. FIG. 14 shows the signal intensities of the BF1 (the signal of the region 201). In FIG. 14, a signal intensity 1401 corresponds to a case where the sample material is carbon (atomic weight is 12.01), a signal intensity 1402 corresponds to a case where the sample material is silicon (atomic weight is 28.09), and a signal intensity 1403 corresponds to a case where the sample material is tungsten (atomic weight is 183.9). As described in FIG. 12 and FIG. 13, it can be seen that the signal quantity decreases as the atomic weight becomes larger. Next, FIG. 15 shows the signal intensities of the BF2 (the signal of the region 202). Each of a signal intensity 1501 of carbon and a signal intensity 1502 of silicon has a peak in the middle of the slope. For this reason, if the signal of the BF2 is used in film thickness monitoring, two film thicknesses T1 and T2 are subjected to back calculations with respect to one signal intensity A in the case of carbon, for example, and which one of the two is correct cannot be determined in this case. Such a situation occurs even when the division by the signal described using FIG. 11 is used, if there is a peak in the middle. Meanwhile, in the case of tungsten, a signal intensity 1503 of the BF2 has no peak in the middle. Thus, the signal intensity 1503 of the BF2 can be used in film thickness monitoring. As described above, depending on a constituent element of a sample, the regions that can be used and cannot be used change among the regions 201 to 205. However, even in a case where two film thicknesses such as the T1 and T2 are calculated as in the case of the signal of the BF2 of carbon, if a region of a different element exists near the region, it is possible to perform a film thickness calculation by using filtering or the like to select a value closer to the result of film thickness calculation of the near region of the different element based on a precondition that no drastic film thickness distribution occurs during ion beam processing or the like. To put it specifically, it is important to select a region most suitable for use in film thickness monitoring from the regions 201 to 205. For example, FIG. 16 shows the case of carbon, and a signal intensity 1601 of the DF3 (the signal of the region 205) becomes a signal intensity of almost zero in a thin region 1602. In this case, if the signal of the DF3 is used as the denominator as shown in FIG. 11, divergence occurs, and thus, film thickness monitoring cannot be performed. Meanwhile, a signal intensity 1603 of the DF2 (the signal of the region 204) located adjacent to and in the inner side from the DF3 has a sufficient amount of signal intensity even in the thin region 1602. Thus, it is desirable to use the DF2 as the denominator of the division instead of the DF3 in FIG. 11. As described, the usage to use a different (one located in the inner side, for example) region as the denominator in a region where the actual signal becomes smaller than a predetermined signal intensity Ac, for example, is very effective. In this usage, a region used for the division may be previously determined with respect to a certain element, or the region may be changed to another when the signal intensity becomes smaller than the predetermined signal intensity Ac. Likewise, FIG. 17 shows an example in which a problem occurs in the case of tungsten. In this case, a signal intensity 1701 of the BF1 (the signal of the region 201) becomes a signal intensity of almost zero in a thick region 1702. In this case, if the signal of the BF1 is used as the numerator as shown in FIG. 11, the value becomes almost zero, and thus, film thickness monitoring cannot be performed. Meanwhile, a signal intensity 1703 of the BF2 (the signal of the region 202) located adjacent to and in the outer side from the BF1 has a sufficient amount of signal intensity even in the thick region 1702. Thus, it is desirable to use the BF2 as the numerator of the division instead of the BF1 in FIG. 11. As described, the usage to use a different (one located in the outer side, for example) region as the numerator in a region where the actual signal becomes smaller than a predetermined signal intensity Aw, for example, is very effective. In this usage, a region used for the division may be previously determined with respect to a certain element, or the region may be changed to another when the signal intensity becomes smaller than the predetermined signal intensity Aw.

Figure 18:
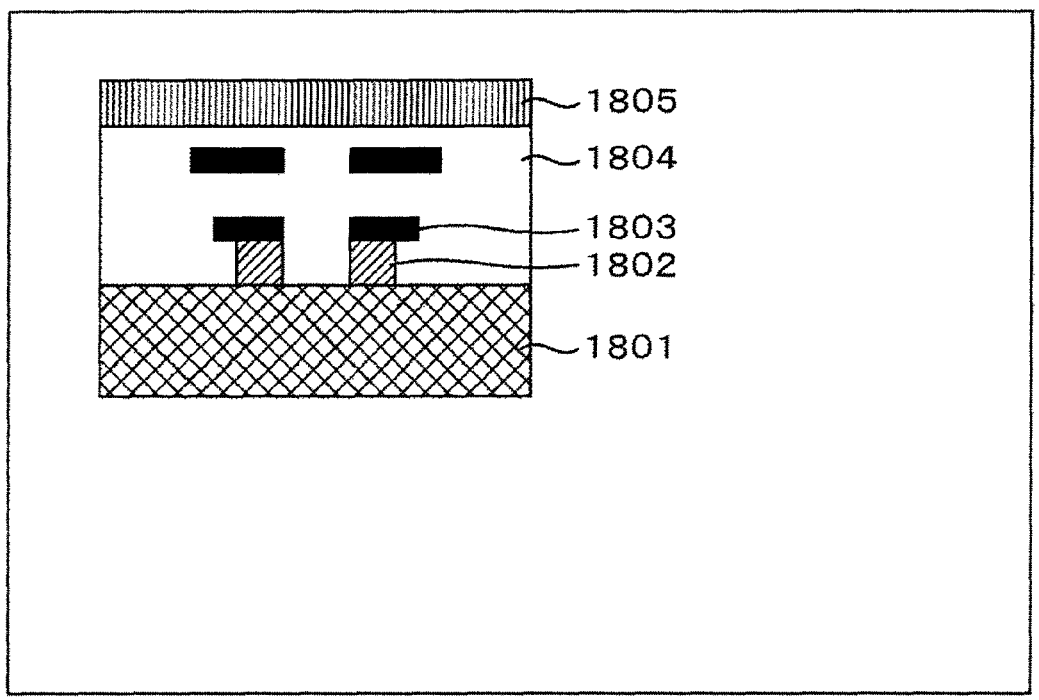
FIG. 18 is a diagram showing an element mapping image of a sample to be processed.
Figure 19:
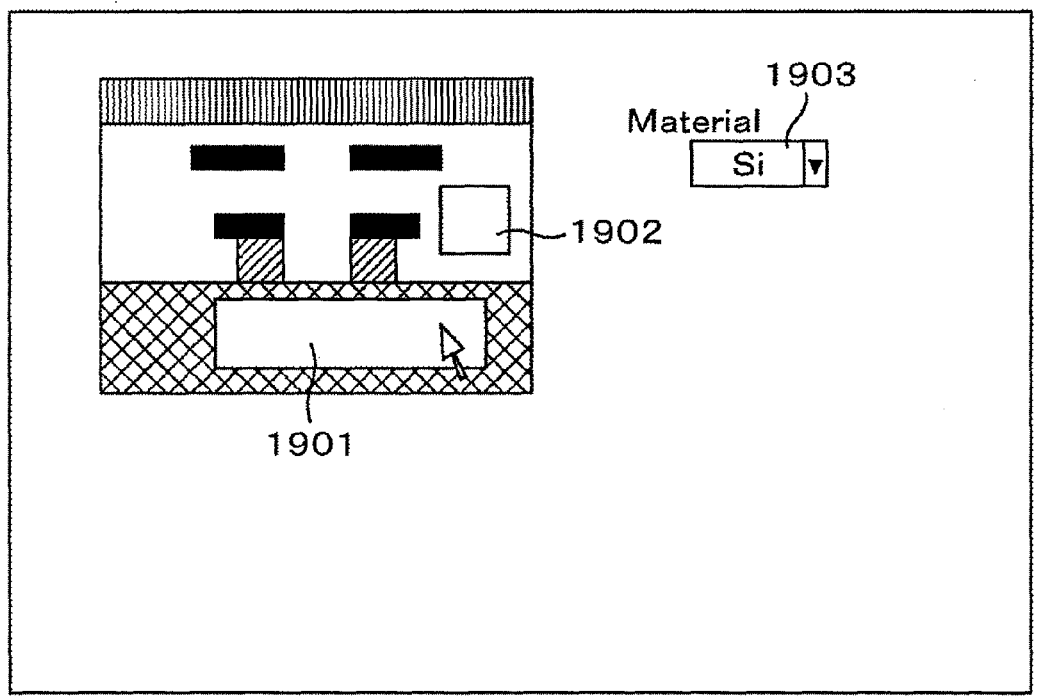
FIG. 19 is a diagram showing an element input method for a sample to be processed.

The aforementioned selection of the signal intensity based on element information needs to acquire the element information before film thickness monitoring. The element information can be acquired from a signal of the X-ray detector 115 in FIG. 1, for example. To put it specifically, it is possible to identify an element of a region by irradiating the sample 101 with the electron beam 109 and detecting an X-ray generated from the irradiation region. Accordingly, an element mapping image as shown in FIG. 18 can be acquired by scanning with the electron beam 109 on a cross section of the sample 101. Here, the elements are displayed using different colors, respectively, and regions 1801, 1802, 1803, 1804 and 1805 are each formed of a different element. Although not illustrated herein, the content density of each of the elements may be displayed by using contrast or the like. The X-ray detection for acquiring the mapping image can be performed simultaneously with the signal detection of each of the regions 201 to 205 by the transmission electron beam detector in FIG. 2, for example. Thus, it is possible to calculate a film thickness almost in real-time by selecting a detection region most suitable for film thickness monitoring from the regions 201 to 205 while acquiring the element information by the X-ray detection, and finding a signal intensity ratio of the selected region by calculation processing. Although the acquisition of element information by the X-ray detection is described herein, the element information can be acquired in the same manner even in a case where a different means such as energy loss spectroscopy, reflection electron energy spectroscopy, or the like is used, for example, and the acquired element information can be used as the film thickness monitoring information.

Moreover, there is a case where a constituent element of the sample 101 is known because of its design as in the case of a semiconductor device or the like. In this case, it is possible to allow the user to previously specify the element. For example, the user is allowed to specify a region 1901 or a region 1902 on a GUI showing an image formed by secondary electrons, reflection electrons, or transmission electrons by scanning with the electron beam 109, and to input a constituent element of the region 1901, for example, to an element input field 1903. Here, an example in which silicon (Si) is selected from a pull-down menu is shown. Accordingly, a detection region most suitable for silicon in monitoring the film thickness of the region 1901, for example, can be automatically selected from the regions 201 to 205 (selection of the region 201 as the numerator and selection of the region 205 as the denominator or the like, for example). Accordingly, such manual input of the elemental species also allows removal of the X-ray detector 115 and the X-ray detector control unit 116 in FIG. 1 from the apparatus configuration.

In the above description, an assumption is made that the energy of irradiation electrons is constant (30 kV, for example), for the sake of simplicity of description, but it is also possible to change the energy of irradiation electrons, actually. In reality, the transmission electron volume changes depending on the energy of irradiation electrons, and the signal ratio itself of the regions 201 to 205 of the detector 206 also changes. To put it specifically, the signal intensities shown in FIG. 7, FIG. 8, FIG. 9, FIG. 10, FIG. 11, FIG. 14, FIG. 15, FIG. 16, FIG. 17 and the like also change depending on the energy of irradiation electrons. As a trend, when the energy of irradiation electrons is reduced, the signal intensity of the entire transmission electrons is reduced, but the signal intensities of the regions 201 to 205 are not reduced in the same proportion. The amount of reduction is larger in the transmission electron volume near or in the region 201 (in the vicinity of the center). For this reason, when the energy of irradiation electrons is changed, it is preferable to change calibration curves corresponding to FIG. 7, FIG. 8, FIG. 9, FIG. 10, FIG. 11, FIG. 14, FIG. 15, FIG. 16, FIG. 17 and the like and also to change the regions 201 to 205 used for the calculation, depending on the energy of irradiation electrons. However, the policy of selecting the region most suitable for the calculation remains the same as the policy described above. The signal most sensitive for a change in the film thickness can be acquired in a case where the division is performed by selecting the region in which the signal increases monotonically with respect to a decrease in the film thickness and which has the highest change rate, and the region in which the signal monotonically decreases with respect to a decrease in the film thickness and which has the highest change rate. Thus, this case is the optimum selection of regions. However, in case of a region or an element with which the signal intensity becomes too small, the region to be selected is changed to a second candidate region as described above. Accordingly, it is possible to achieve accurate film thickness monitoring even in a case where the energy of irradiation electrons is changed.

Here, FIG. 20 to FIG. 26 show a film thickness display method in a case where film thickness information is acquired by the aforementioned method.

Figure 20:
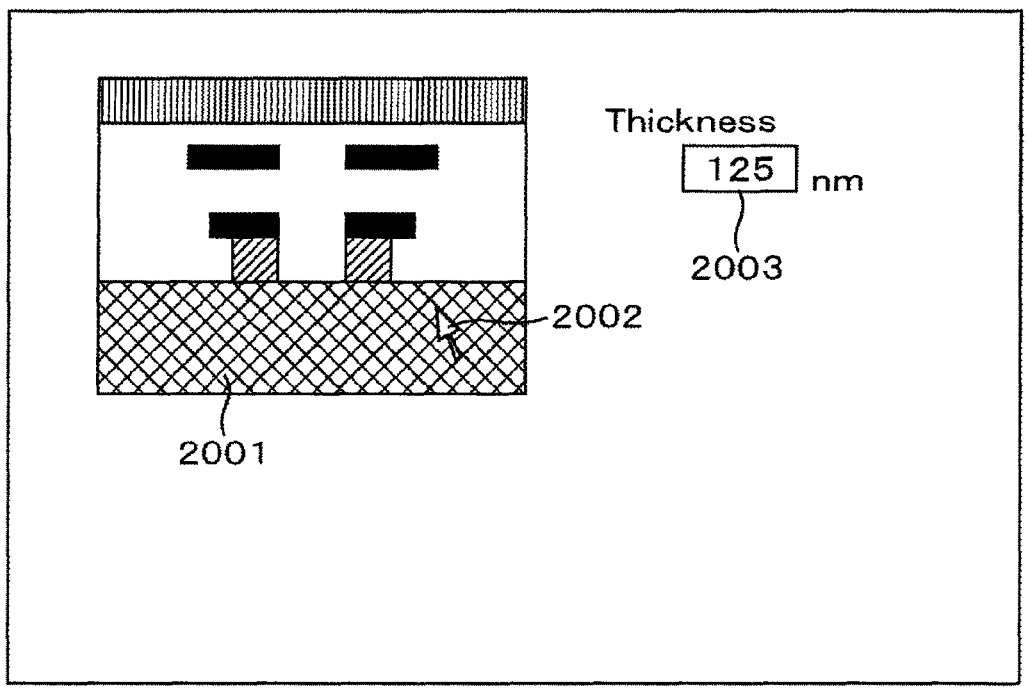
FIG. 20 is a diagram showing an example of numeric film thickness display by designation using cursor pointing.

A secondary electron image 2001 in FIG. 20 is a cross sectional image of the sample 101. Although a secondary electron image is used herein, the type of image is not limited to a secondary electron image, and a transmission electron image, a reflection electron image, or an element mapping image or the like may be used. It is preferable to use an image of the sample 101 acquired by scanning with the electron beam 109. This is because no positional error of a region specified in film thickness monitoring occurs in this case because the image has the same deflection scanning information as the electron beam 109 used in the film thickness monitoring. Here, when a position of a film thickness desired to be monitored is specified by a cursor 2002, the film thickness calculated by the aforementioned method is displayed in a film thickness display field 2003.

Figure 21:
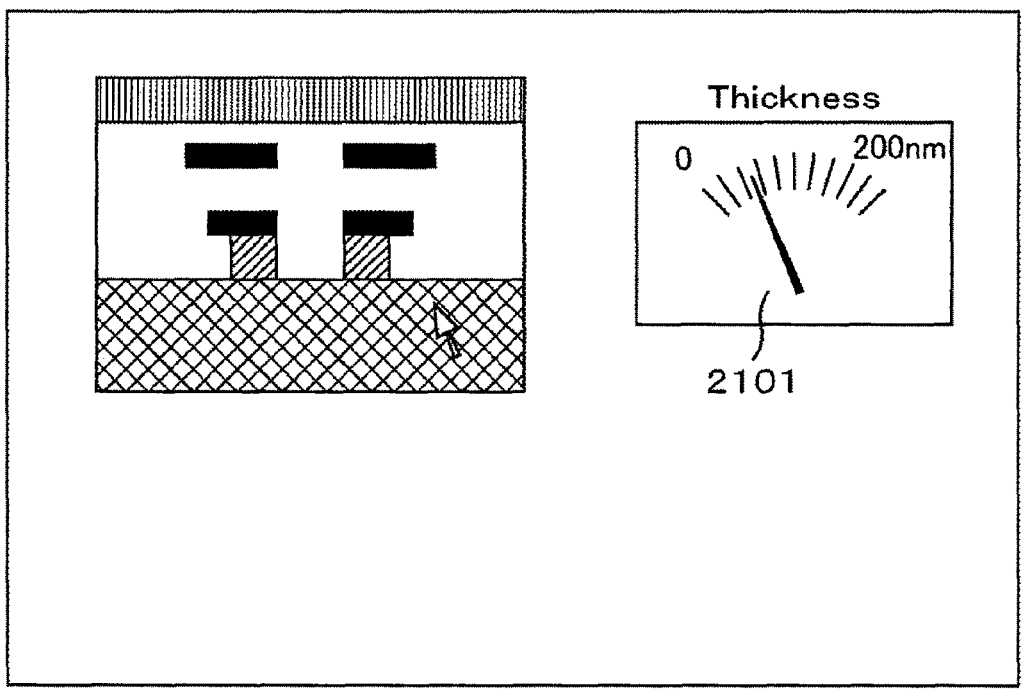
FIG. 21 is a diagram showing an example of meter film thickness display by designation using cursor pointing.

In addition, a meter display field 2101 in FIG. 21 is configured to show a value of the film thickness corresponding to the cursor position by a deflecting needle. The user is allowed to visually recognize a change in the film thickness depending on the position by moving the cursor on the secondary electron image or the like and checking the degree of deflection of the needle. Moreover, if film thickness monitoring is performed simultaneously with processing by the ion beam 104 with the meter display field 2101, how the film thickness is reduced by the processing can be visually recognized by the deflection of the needle of the meter. Thus, the progress status of the processing is easily understood in this case.

Figure 22:
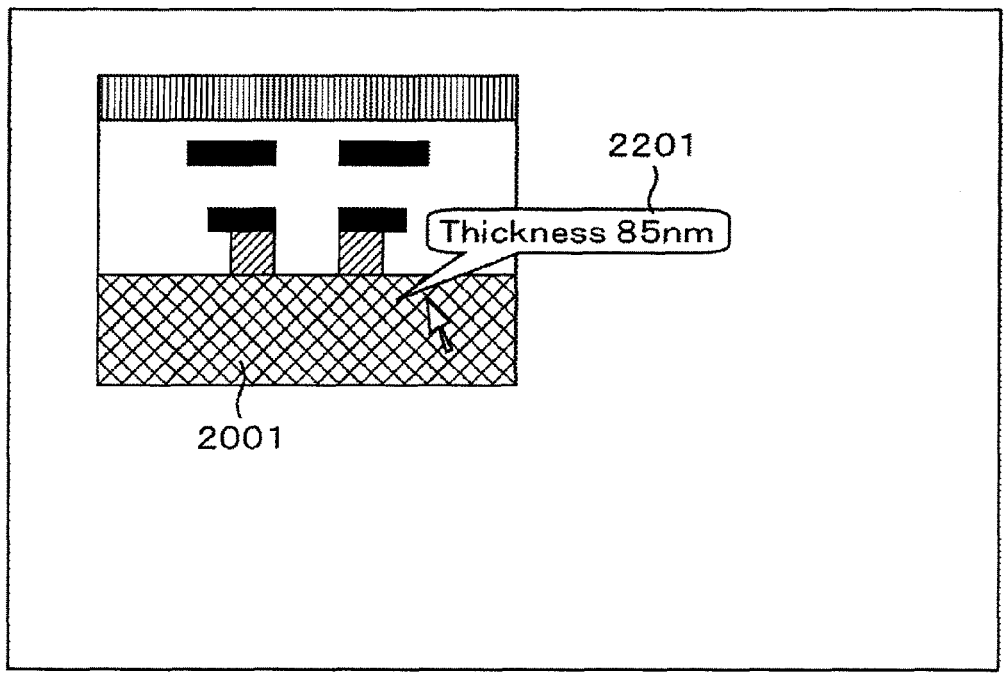
FIG. 22 is a diagram showing an example of popup film thickness display by designation using cursor pointing.

Moreover, it is also possible to show a popup display as shown in FIG. 22. A popup 2201 is a balloon displayed near the cursor position and displays the film thickness corresponding to the cursor position on the secondary electron image or the like as a numeric value in the balloon. Accordingly, the user can recognize the film thickness without taking his or her eyes off the secondary electron image 2001.

Figure 23:
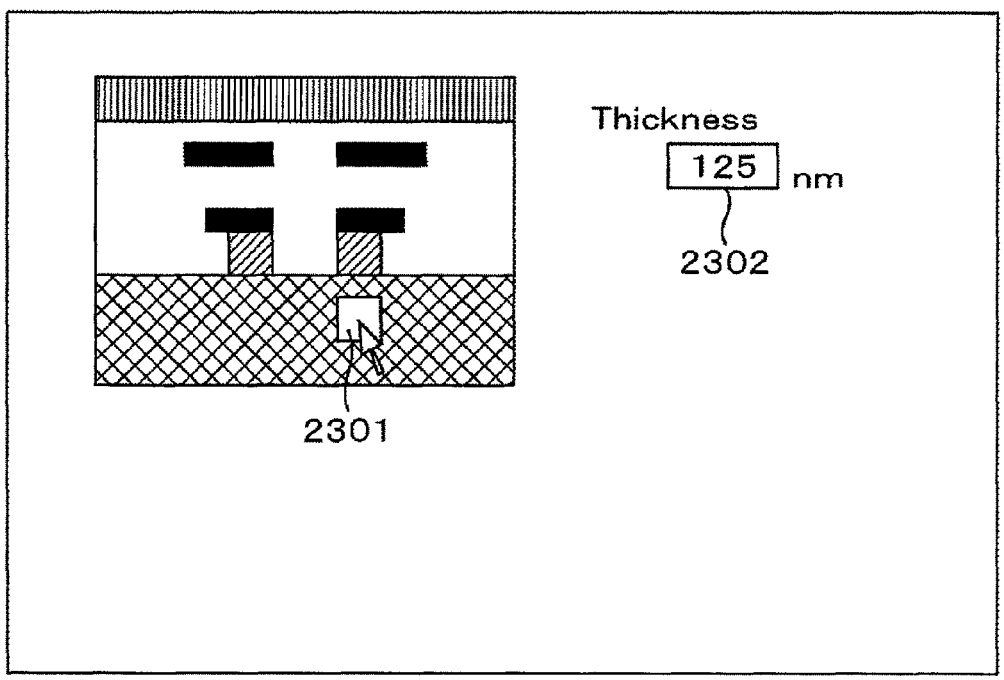
FIG. 23 is a diagram showing an example of numeric film thickness display by designating a region.
Figure 24:
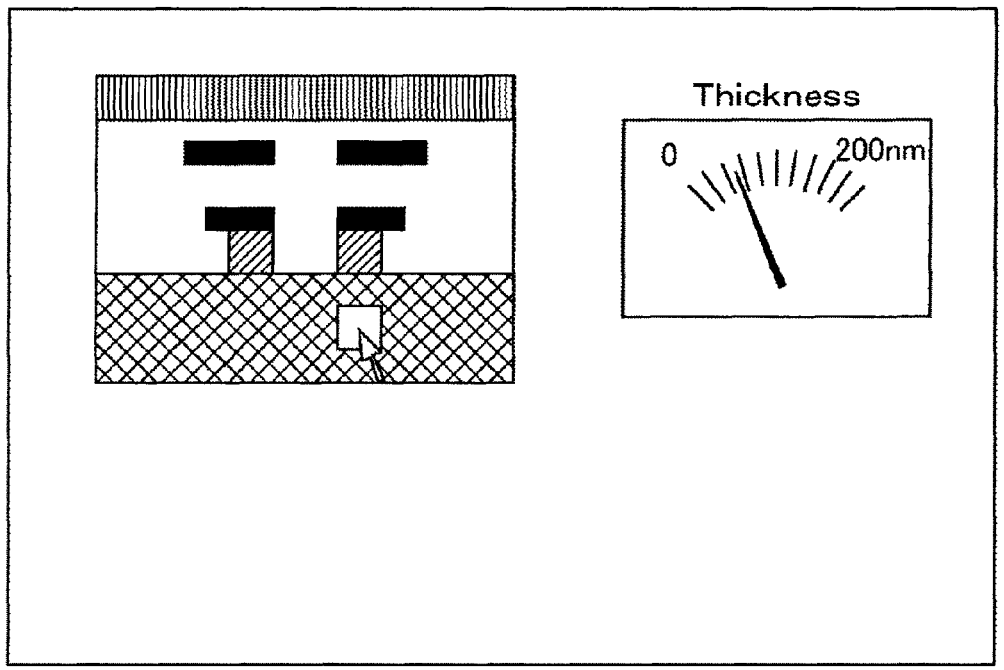
FIG. 24 is a diagram showing an example of meter film thickness display by designating a region.
Figure 25:
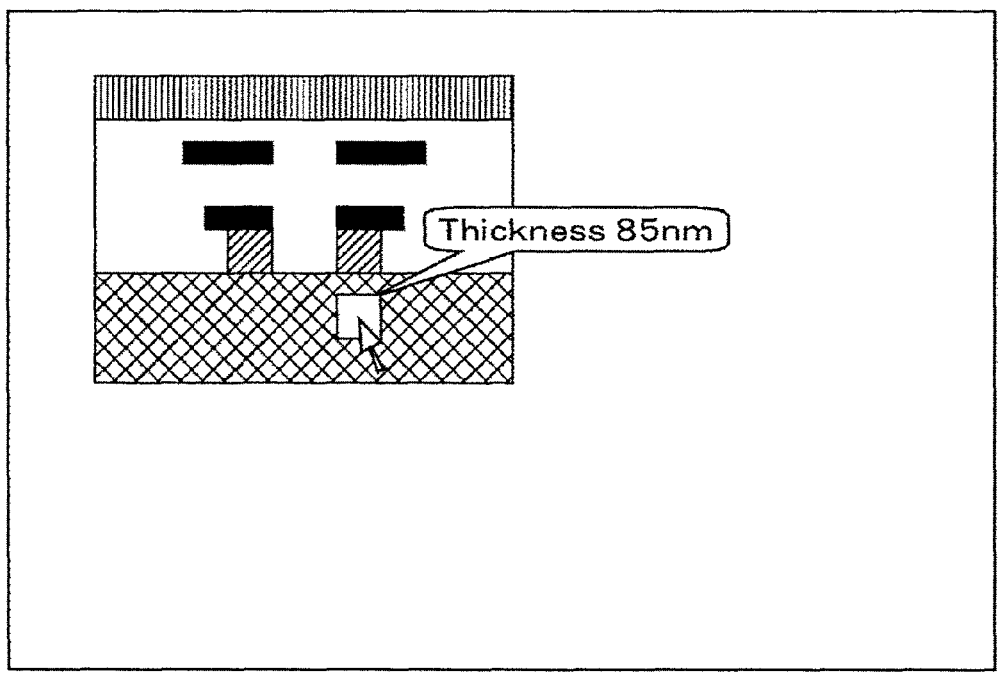
FIG. 25 is a diagram showing an example of popup film thickness display by designating a region.

How the film thickness information at the point designated by the cursor is displayed has been described above. Meanwhile, there is a case where average information on a region having a certain area is desired to be known. FIG. 23 to FIG. 25 show a display example of this case.

FIG. 23 shows an example of numeric film thickness display by designating a region. A monitor region 2301 in FIG. 23 is the region where average information is acquired and its size and position are changeable. For example, the size can be set by drag operation and the position is changeable by a cursor, or arrow keys or the like on the keyboard. The film thickness of this region is displayed in a film thickness display field 2302. Note that, the meter display as shown in FIG. 24 or the popup display as shown in FIG. 25 may be used herein. In the processing of a cross section by ion beam, a precipitous change in the film thickness hardly occurs in plane. Thus, when a thickness of a film fabricated by ion beam in particular is to be measured, information more stable than the point data shown in FIG. 20 to FIG. 22 can be obtained by using the film thickness display of the average information on the area as described herein.

Figure 26:
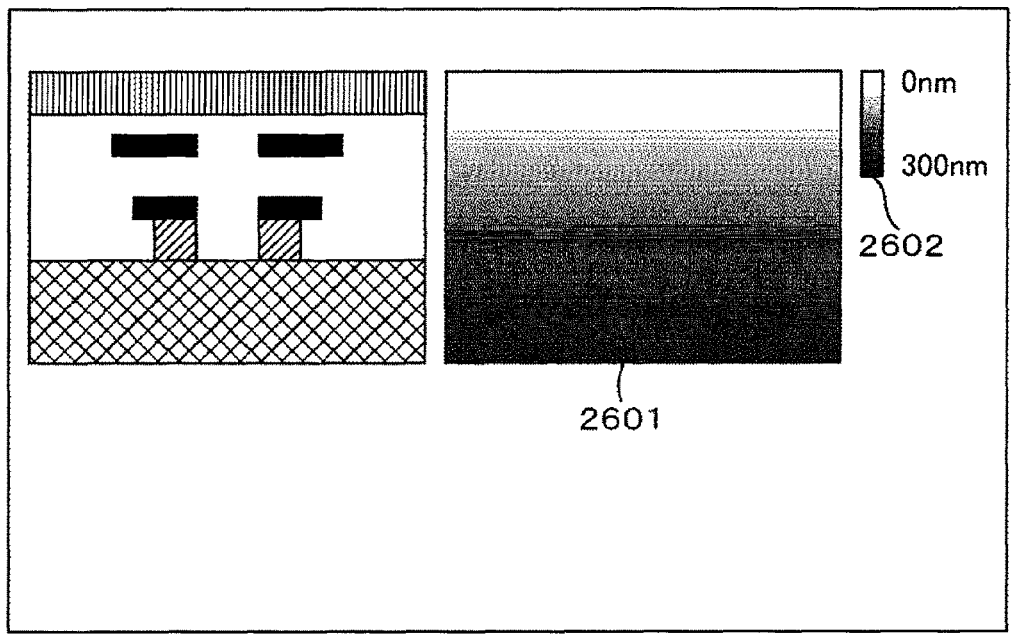
FIG. 26 is a diagram showing an example of film thickness mapping image display.

Furthermore, as shown in FIG. 26, for example, it is possible to display a film thickness distribution of a corresponding region of a secondary electron image or the like by assigning contrast or false color or the like to the calculated film thickness and then changing the contrast or color in a film thickness distribution field 2601. In this case, the film thickness distribution in accordance with the positions can be viewed at once. The film thickness can be recognized by comparing a contrast bar 2602 with the contrast of the film thickness distribution display field 2601, for example. In the example shown in FIG. 26, how the film thickness becomes thinner in the upper direction and becomes thicker in the lower direction can be seen. Note that, it is also possible to display a correct numeric value or the like as in the cases shown in FIG. 20 to FIG. 25 by locating the cursor or average region on the film thickness distribution display field 2601. In this case, both of the overall trend and detailed numeric value can be recognized.

As described above, the regions used in film thickness monitoring are automatically selected from the regions 201 to 205 of the detector 206 of the transmission electron beam in accordance with the element or the like, or the film thickness (the signal quantity). However, it is also important to show the user which regions are selected. Moreover, it is preferable to allow the user to specify which regions among the regions 201 to 205 are used. In this respect, FIG. 27 shows a GUI display example of the light reception region of the transmission electron detector.

Figure 27:
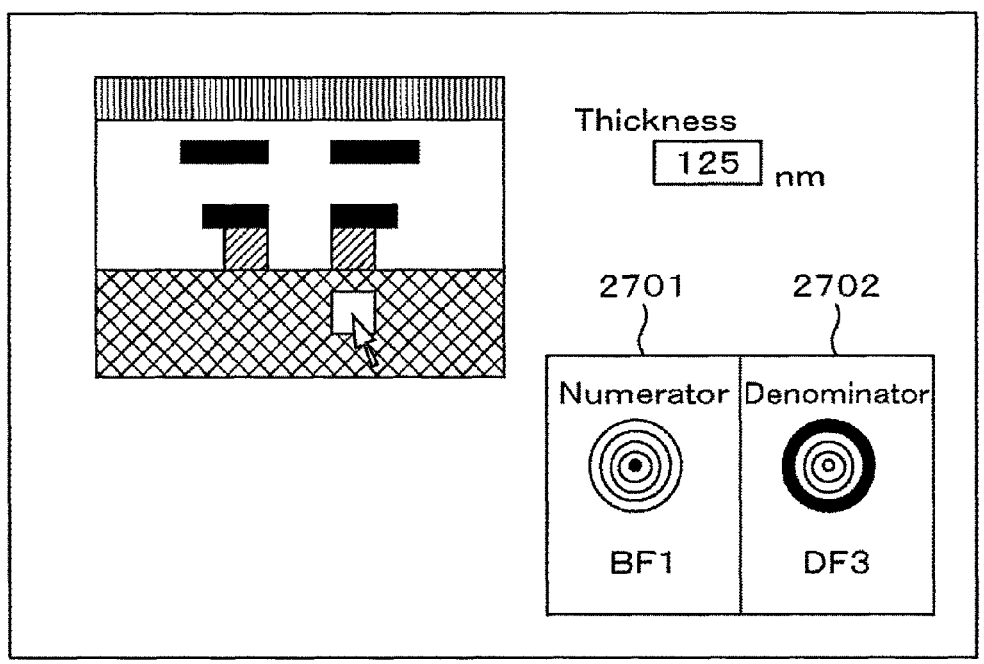
FIG. 27 is a diagram showing a GUI display example of light reception regions of the transmission electron detector.
Figure 28:
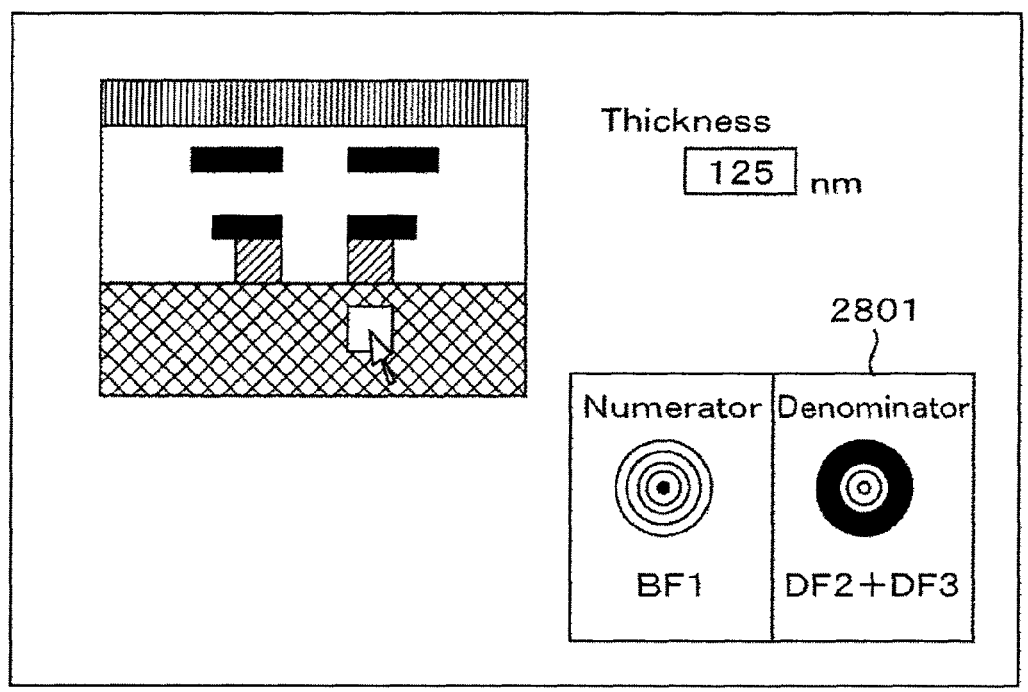
FIG. 28 is a diagram showing a GUI display example of multiple region addition of light reception regions of the transmission electron detector.

In FIG. 27, a numerator-use region display field 2701 displays the region used for the numerator of the calculation. In the example shown in FIG. 27, the signal of the BF1 selected for the region 201 is displayed. Meanwhile, a denominator-use region display field 2702 displays the region used for the denominator of the calculation. In this example, the signal of the DF3 selected for the region 205 is displayed. While the selected regions of the detector are displayed in the manner described above, the user is also allowed to specify a region of the detector by selecting a region for the numerator-use region display field 2701 or the denominator-use region display field 2702 by cursor. Moreover, as shown in an example of a denominator-use region display field 2801 in FIG. 28, addition of multiple regions may be used for the denominator or the like. Here, the same applies to the numerator-use region display field.

A semiconductor device included in the transmission electron detector control unit 114 performs the calculation processing of the signals of the selected ones of the regions 201 to 205 in this example. Accordingly, high speed real-time processing is possible. Meanwhile, the calculation operation can be performed as software processing on the central processor 117, for example, instead of the hardware calculation operation described above. In this case, a variety of calculation processing operations can be added by changing the program.

As described above, the charged particle beam apparatus of Embodiment 1 is capable of accurately monitoring a film thickness of a sample to be processed by an ion beam, thus allowing a highly accurate observation and fabrication of a sample for analysis.

Embodiment 2

In this embodiment, a charged particle beam apparatus capable of extracting a fine sample piece from an original sample by ion beam processing is described. Differences from Embodiment 1 will be mainly described below.

Figure 29:
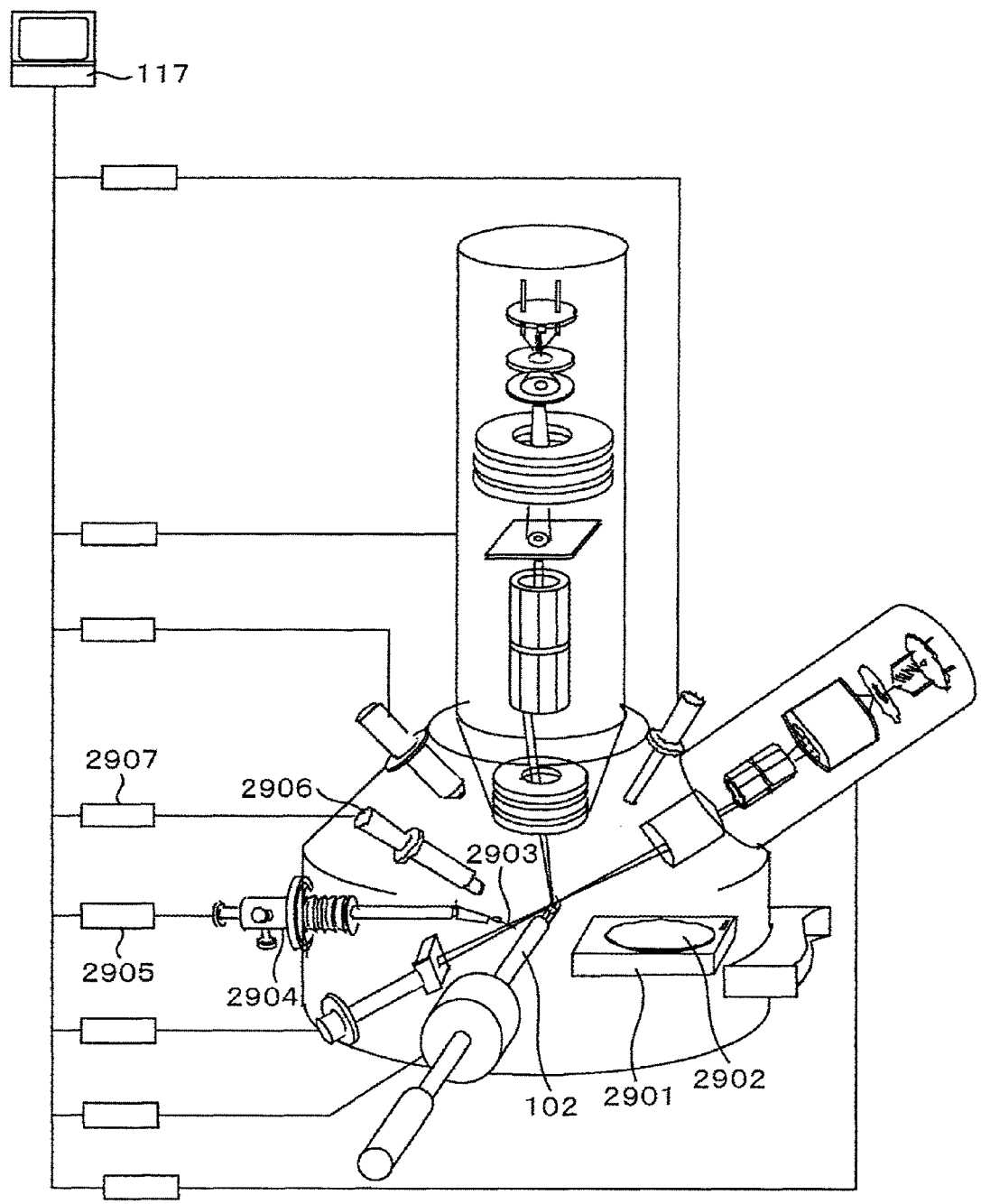
FIG. 29 is a diagram showing a configuration example of a charged particle beam apparatus provided with a fine sample piece extraction feature.

FIG. 29 shows a configuration example of a charged particle beam apparatus provided with a fine sample piece extraction feature. An original sample 2902 such as a semiconductor wafer or chip, or body can be placed on an original sample stage 2901, for example. A probe 2903 for extracting a sample piece from the original sample 2902 is held at the tip of a probe drive mechanism 2904. A probe control unit 2905 controls the position or the like of the probe. A gas source control unit 2907 controls an assist gas source 2906, which supplies an assist gas used for ion beam assisted deposition and ion beam assisted etching. A central processor 117 controls the probe control unit 2905, the gas source control unit 2907 and the like. Note that, a micro-fork capable of holding a sample piece in between or a micromanipulator capable of holding a sample piece may be used instead of the probe.

Figure 30:
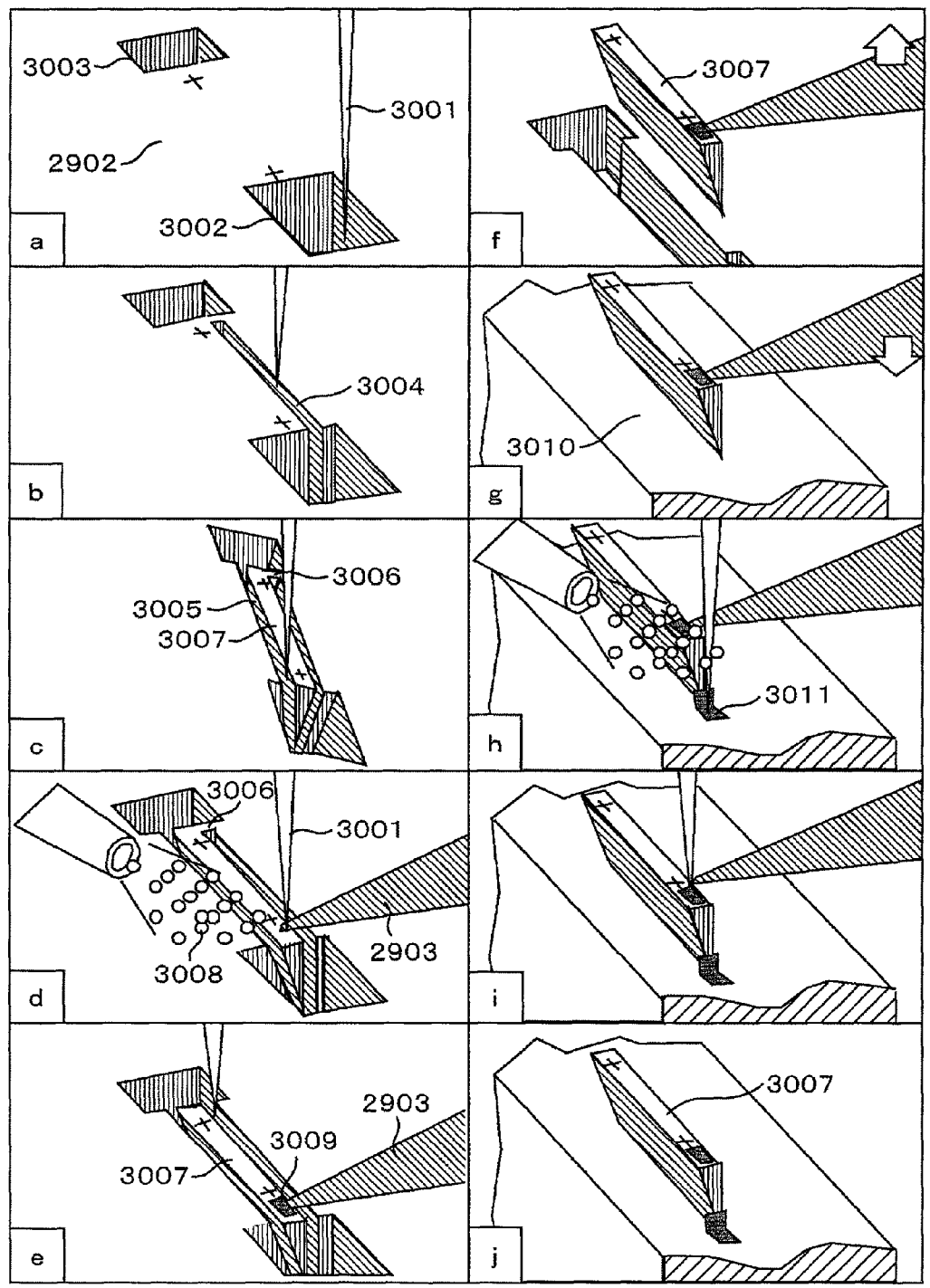
FIG. 30 is a diagram for describing an extraction procedure of a fine sample piece.
Figure 31:
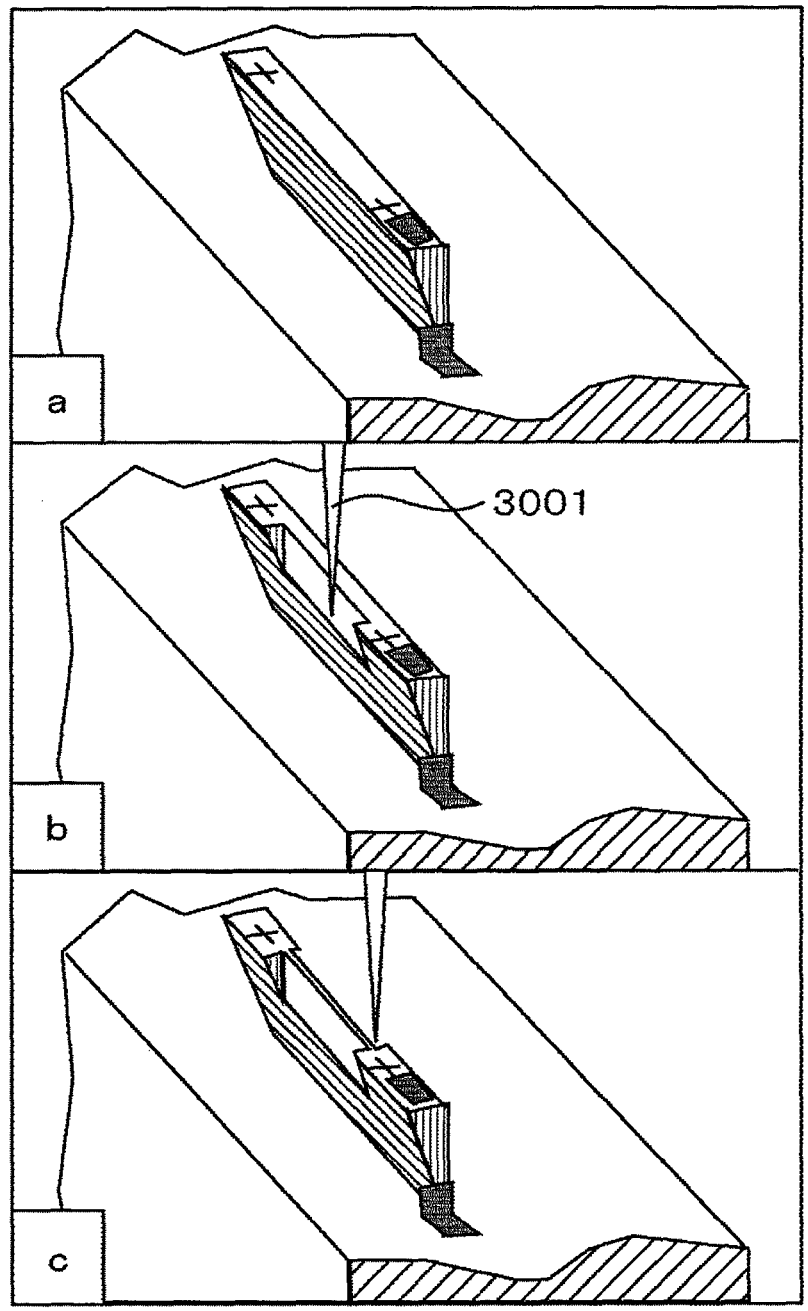
FIG. 31 is a diagram for describing processing of a thin film of a fine sample piece.

Here, fabrication of a thin film from a fine sample piece extracted by ion beam processing will be described using FIG. 30 and FIG. 31. FIG. 30 shows a flow of extracting a fine sample piece.

(a, b) First, processing of three rectangular holes 3002, 3003, and 3004 by an ion beam 3001 is performed around (three side directions) a desired cross section in the original sample 2902 placed on the original sample stage 2901.

(c) Next, a sample piece 3007 supported on the original sample 2902 by a supporting portion 3006 alone is fabricated by inclining the original sample stage 2901 and performing processing of a groove 3005.

(d, e) Next, the original sample stage 2901 is returned to the original position from the inclined position, and the tip of the probe 2903 is brought into contact with the sample piece 3007 by the probe drive mechanism 2904. Thereafter, a deposition film 3009 (a tungsten film in the case of this embodiment) is formed by irradiating a region including the tip of the probe with the ion beam 3001 while supplying a deposition gas 3008 thereto from the assist gas source 2906, thus fixing the sample piece 3007 and the probe 2903.

(f, g) After the sample piece 3007 and the probe 2903 are fixed, the sample piece 3007 is separated from the original sample 2902 by removing the supporting portion 3006 by ion beam processing.

(h) The sample piece 3007 thus separated is brought into contact with a sample carrier 3010 by driving the probe. This sample carrier 3010 is placed on a sample stage 102 shown in FIG. 29. Then, a deposition film 3011 is formed in the contact portion by the same method as the aforementioned one, thus, fixing the sample piece 3007 and the sample carrier 3010.

(i) After the sample piece 3007 and the sample carrier 3010 are fixed, the tip of the probe is subjected to ion beam processing to separate the probe therefrom. Thus, the sample piece 3007 is made independent from the probe.

Next, fabrication of a thin film will be described using FIG. 31.

(a, b) A desired cross section is irradiated with an ion beam 3001 in parallel and then processed until the vicinity of the desired cross section.

(c) Furthermore, an opposite side of the desired cross section is irradiated with the ion beam 3001 and then processed until the vicinity of the desired cross section.

The FIB beam processing is performed on the two sides while the processing described in (b) and (c) is repeated, thereby completing the processing of a target thin film. Fabrication of a thin film sample having a desired film thickness is made possible by irradiating the thin film portion with an electron beam and monitoring the film thickness as shown in Embodiment 1, during the processing of the thin film or between the steps of the processing of the thin film. Moreover, in a case where the processing of a thin film shown in (b) and (c) of FIG. 31 is performed automatically, the processing shown in (b) and (c) of FIG. 31 is repeated automatically until the film is reduced to a previously set film thickness, and then, the processing, i.e., ion beam irradiation is stopped when the film thickness monitoring information matches the previously set film thickness.

Since the sample piece as shown in this embodiment can be held on the thin sample carrier 3010, the possibility of the sample piece interrupting the transmission of the electron beam for film thickness monitoring is reduced. Thus, accurate film thickness monitoring can be easily performed. Such reduction is also effective in the acquisition of element information by the detection of X-ray described in Embodiment 1. Specifically, the possibility of wrong element information being acquired due to irradiation of a vicinity region with scattered electrons is reduced. Thus, accurate film thickness measurement can be performed. Moreover, an operation to process a sample having an accurate film thickness for a desired observation portion from a large original sample can be performed in a single vacuum sample chamber. Accordingly, fabrication of a thin film sample can be surely performed even with a sample that changes its properties in reaction with the atmosphere. Thus, the processing throughput can be improved.

Embodiment 3

In this embodiment, a charged particle beam apparatus using a gas ion beam in thin film finishing processing is described. Differences from Embodiment 1 and Embodiment 2 will be mainly described below.

Figure 32:
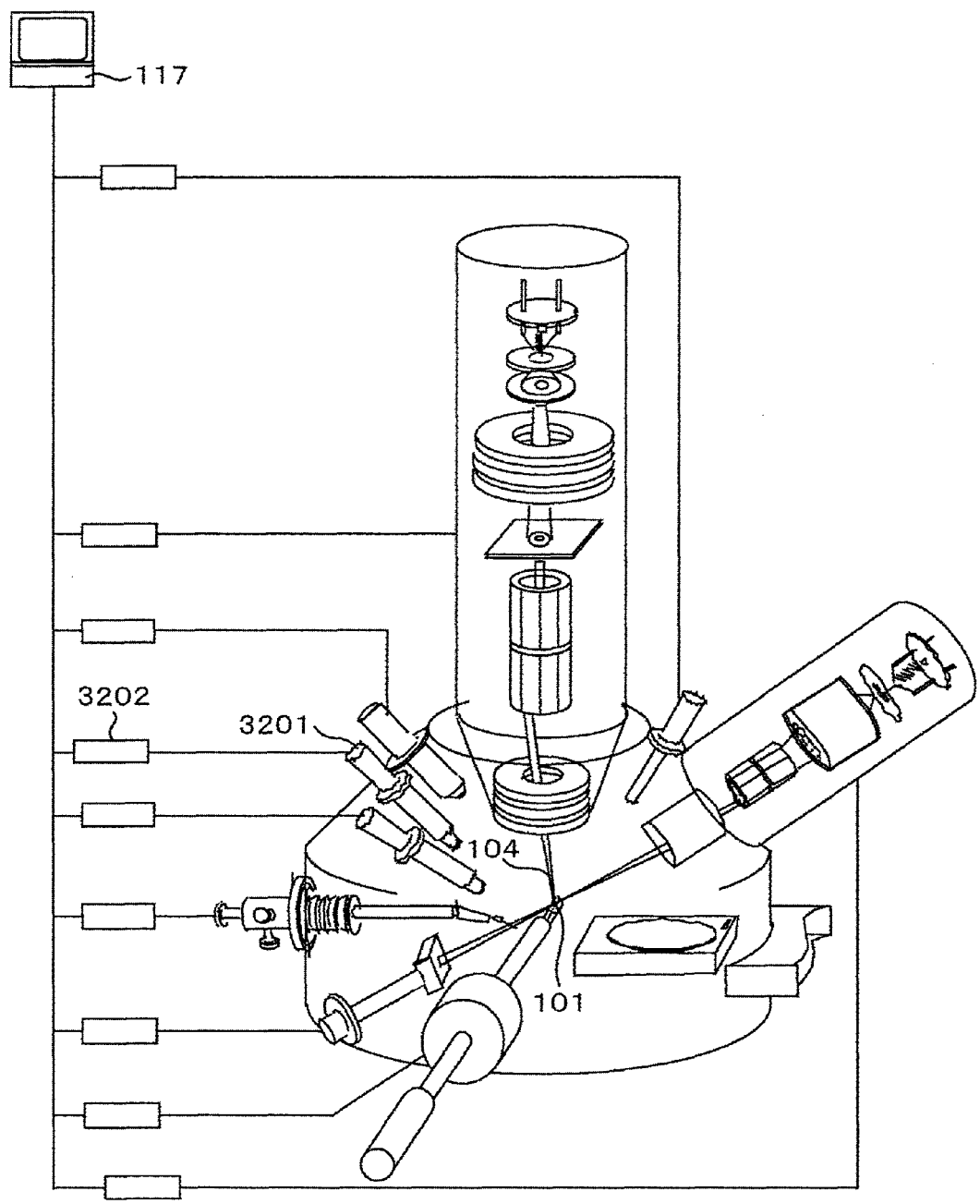
FIG. 32 is a diagram showing a configuration example of a charged particle beam apparatus provided with a gas ion beam.

FIG. 32 shows a configuration example of a charged particle beam apparatus provided with a gas ion beam. A gas ion beam optical system control unit 3202 controls a gas ion beam optical system 3201, which irradiates a sample 101 with a gas ion beam. A central processor 117 controls the gas ion beam optical system control unit 3202 as in the cases of the other control units.

In the current situation, a gallium ion beam is generally used as the ion beam 104 used in the processing of a thin film. This is because a gallium ion beam is excellent in its convergence properties and thus effective in microfabrication. However, gallium itself is a heavy metal, so that the presence of residual gallium on the processed sample is not preferable for analysis or the like. Moreover, high acceleration properties are required for focusing an ion beam finely, but a layer called a damage layer is formed when processing is performed with a high acceleration ion beam. In a case where a sample to be processed is made of silicon crystals, for example, if the sample is processed using a gallium ion beam having an acceleration equal to approximately 30 kV, the silicon crystals are broken, and an amorphous layer having a thickness of approximately 30 nm is formed on each side.

In order to remove such a heavy metal contaminated layer or a damage layer, it is effective to use a low acceleration gas ion beam in the finishing processing. As the gas ion, argon, xenon, or the like is often used, for example. The finishing processing is performed by irradiating the thin film with such gas ion at a low acceleration equal to or lower than 1 kV.

Figure 33:
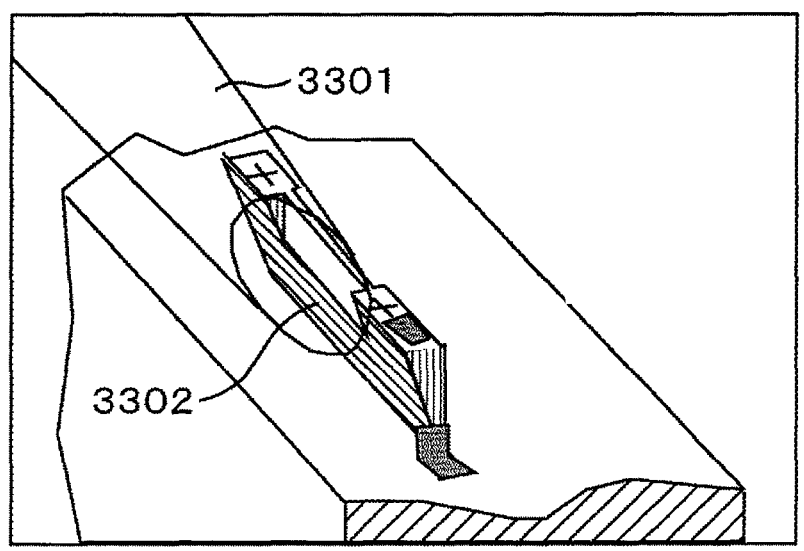
FIG. 33 is a diagram for describing finishing processing by gas ion beam.

FIG. 33 shows how the aforementioned finishing processing is performed. The thin film of the sample is irradiated with a gas ion beam 3301 for irradiation of a region 3302. In the current situation, since it is difficult to focus down the irradiation region of the gas ion beam unlike in the case of a gallium ion beam, a broad area is irradiated with the gas ion beam as the final finishing step after fabrication of a thin film by using a gallium ion beam. In this case, since it is difficult to accurately perform positioning of the irradiation position of a gas ion beam unlike in the case of a gallium ion beam, time management is used to control the processing, instead of irradiation position management. Here, the film thickness monitoring by transmission electrons as described in Embodiment 1 and Embodiment 2 makes it possible to acquire the film thickness information during the gas ion beam irradiation or between the irradiation steps. The finishing processing management can be made by stopping the gas ion beam irradiation when the film thickness monitoring information matches the previously set film thickness, or the like.

The apparatus configuration shown in this embodiment allows end point control of the finishing processing. Thus, fabrication of a higher quality thin film can be achieved.

Industrial Applicability

The present invention contributes to an improvement in failure analysis or structure analysis techniques of semiconductor devices. Moreover, the present invention is applicable to high-resolution observations of not only semiconductor devices but also of iron and steel, lightweight metal, polymer high molecule, or living body samples and the like.

Note that, the aforementioned embodiments describe the advantage that samples each having an accurate film thickness can be fabricated by the apparatus in which ion beam processing and film thickness monitoring features are integrated into a single configuration, but monitoring of a film thickness can be performed in the configuration even if the ion beam optical system is removed therefrom. Thus, the present invention can be used in an apparatus configured to measure a film thickness of a sample fabricated by another ion beam apparatus or a film thickness of a sample fabricated by mechanical polishing or chemical polishing or the like.

EXPLANATION OF THE REFERENCE NUMERALS

101, 501, 601, 1201, 1301 sample
102 sample stage
103 sample position control unit
104, 3001 ion beam
105 ion beam optical system
106 ion beam optical system control unit
107 secondary electron detector
108 secondary electron detector control unit
109 electron beam
110 electron beam optical system
111 electron beam optical system control unit
112, 502, 1202 transmission electron beam
113 transmission electron detector
114 transmission electron detector control unit
115 X-ray detector
116 X-ray detector control unit
117 central processor
118 display unit
201 to 205, 301 to 305, 1801 to 1805, 1901, 1902, 3302 region
206 detector
701, 702, 801 to 805, 901, 902, 1001, 1002, 1101, 1401 to 1403, 1501 to 1503, 1601,
1603, 1701, 1703 signal intensity
1602 thin region
1702 thick region
1903 element input field
2001 secondary electron image
2002 cursor
2003, 2302 film thickness display field
2101 meter display field
2201 popup
2301 monitor region
2601 film thickness distribution display field
2602 contrast bar
2701 numerator-use region display field
2702, 2801 denominator-use region display field
2901 original sample stage
2902 original sample
2903 probe
2904 probe drive mechanism
2905 probe control unit
2906 assist gas source
2907 gas source control unit
3002 to 3004 rectangular hole
3005 groove
3006 supporting portion
3007 sample piece
3008 deposition gas
3009, 3011 deposition film
3010 sample carrier
3201 gas ion beam optical system
3202 gas ion beam optical system control unit
3301 gas ion beam

The invention claimed is:

1. A charged particle beam apparatus comprising:
an electron beam optical system configured to emit an electron beam;
a sample stage on which a sample is to be placed; and
a transmission electron detector configured to detect a transmission electron, wherein
the transmission electron detector comprises a detection portion divided into a plurality of regions,
the charged particle beam apparatus comprises a calculation mechanism configured to calculate a film thickness of the sample based on an intensity ratio of a transmission electron beam detected by a first region of the plurality of regions to a transmission electron beam detected by a second region thereof; and
a display unit configured to display the film thickness of the sample.

2. The charged particle beam apparatus according to claim 1, wherein the calculation mechanism divides a transmission electron beam intensity detected by a region for detecting a transmission electron beam at a small scattering angle by a transmission electron beam intensity detected by a region for detecting a transmission electron beam at a large scattering angle.

3. The charged particle beam apparatus according to claim 1, wherein the calculation mechanism changes the first region and/or the second region in a case where transmission electron beam detection detected by the first region and/or the second region meets a predetermined condition.

4. The charged particle beam apparatus according to claim 1, wherein the calculation mechanism changes the first region and/or the second region on the basis of a constituent element of a portion of the sample which is irradiated with the electron beam.

5. The charged particle beam apparatus according to claim 1, further comprising a spectroscopic detector configured to detect a constituent element of the sample.

6. The charged particle beam apparatus according to claim 5, wherein the spectroscopic detector is an X-ray detector.

7. The charged particle beam apparatus according to claim 1, further comprising an input device configured to input a constituent element of the sample.

8. The charged particle beam apparatus according to claim 1, wherein the display device displays an average film thickness in a desired region of the sample.

9. The charged particle beam apparatus according to claim 1, wherein the display device displays a film thickness distribution in a desired region of the sample.

10. The charged particle beam apparatus according to claim 1, further comprising an ion beam optical system configured to irradiate the sample with an ion beam.

11. The charged particle beam apparatus according to claim 10, wherein the ion beam optical system controls the irradiation with the ion beam on the basis of output of the calculation mechanism.

12. The charged particle beam apparatus according to claim 10, wherein the charged particle beam apparatus is capable of emitting the ion beam and the electron beam simultaneously.

13. The charged particle beam apparatus according to claim 10, further comprising a transport mechanism configured to transport a sample piece separated from an original sample by ion beam processing.

14. A film thickness measurement method for a sample, the method comprising:
irradiating a sample with an electron beam by an electron beam optical system;
detecting a transmission electron beam having passed through the sample, by a transmission electron detector including a detection portion divided into a plurality of regions;
calculating, by a calculation mechanism, a film thickness of the sample based on an intensity ratio of a transmission electron beam detected by a first region of the plurality of regions to a transmission electron beam detected by a second region thereof; and
displaying the film thickness of the sample by a display unit.

15. The film thickness measurement method according to claim 14, wherein the calculation mechanism divides a transmission electron beam intensity detected by a region for detecting a transmission electron beam at a small scattering angle by a transmission electron beam intensity detected by a region for detecting a transmission electron beam at a large scattering angle.

16. The film thickness measurement method according to claim 14, wherein the first region and/or the second region is changed in a case where transmission electron beam detection detected by the first region and/or the second region meets a predetermined condition.

17. The film thickness measurement method according to claim 14, wherein the first region and/or the second region is changed on the basis of a constituent element of a portion of the sample which is irradiated with the electron beam.

18. The film thickness measurement method according to claim 14, further comprising detecting a constituent element of the sample by a spectroscopic detector.

19. The film thickness measurement method according to claim 18, wherein the spectroscopic detector is an X-ray detector.

20. The film thickness measurement method according to claim 14, further comprising inputting a constituent element of the sample to the calculation mechanism by an input device.

21. The film thickness measurement method according to claim 14, wherein an average film thickness in a desired region of the sample is displayed.

22. The film thickness measurement method according to claim 14, wherein a film thickness distribution in a desired region of the sample is displayed.

23. The film thickness measurement method according to claim 14, further comprising forming a thin film in the sample by irradiating the sample with an ion beam by an ion beam optical system.

24. The film thickness measurement method according to claim 23, wherein the ion beam optical system controls the irradiation with the ion beam on the basis of output of the calculation mechanism.

25. The film thickness measurement method according to claim 23, wherein the formation of a thin film in the sample by the irradiation with the ion beam and measurement of the thin film by the irradiation with the electron beam are performed simultaneously.

26. The film thickness measurement method according to claim 23, further comprising measuring a film thickness of a sample piece separated from an original sample by ion beam processing.

* * * * *